US007929777B2

(12) United States Patent
Nagata et al.

(10) Patent No.: US 7,929,777 B2
(45) Date of Patent: Apr. 19, 2011

(54) VARIABLE LENGTH DECODING DEVICE, VARIABLE LENGTH DECODING METHOD AND IMAGE CAPTURING SYSTEM

(75) Inventors: Taichi Nagata, Osaka (JP); Shinji Kitamura, Kyoto (JP)

(73) Assignee: Panasonic Corporation, Osaka (JP)

( * ) Notice: Subject to any disclaimer, the term of this patent is extended or adjusted under 35 U.S.C. 154(b) by 1012 days.

(21) Appl. No.: 11/798,325

(22) Filed: May 11, 2007

(65) Prior Publication Data

US 2007/0263939 A1    Nov. 15, 2007

(30) Foreign Application Priority Data

May 11, 2006  (JP) ................................. 2006-132378
Apr. 26, 2007  (JP) ................................. 2007-116889

(51) Int. Cl.
*G06K 9/36* (2006.01)
*H04M 7/00* (2006.01)
(52) U.S. Cl. ........................................ 382/232; 341/61
(58) Field of Classification Search .................... 341/67; 382/232
See application file for complete search history.

(56) References Cited

U.S. PATENT DOCUMENTS

| 5,369,405 | A | * | 11/1994 | Choi et al. ........................ 341/63 |
| 5,689,254 | A | * | 11/1997 | Fujiwara et al. .................. 341/59 |
| 6,263,109 | B1 | * | 7/2001 | Ordentlich et al. ............ 382/232 |
| 6,510,247 | B1 | * | 1/2003 | Ordentlich et al. ............ 382/232 |
| 6,954,157 | B2 | * | 10/2005 | Kadono et al. .................. 341/67 |
| 6,967,600 | B2 | * | 11/2005 | Kadono et al. .................. 341/67 |
| 6,987,811 | B2 | * | 1/2006 | Tanaka et al. ............ 375/240.25 |
| 7,102,551 | B2 | * | 9/2006 | Takakura et al. ............... 341/67 |
| 2005/0156761 | A1 | | 7/2005 | Oh |
| 2005/0226513 | A1 | * | 10/2005 | Wallace et al. ............... 382/232 |
| 2006/0044165 | A1 | | 3/2006 | Takakura et al. |
| 2006/0104351 | A1 | * | 5/2006 | Teng ......................... 375/240.03 |
| 2006/0104521 | A1 | * | 5/2006 | Teng ............................. 382/232 |
| 2006/0109912 | A1 | | 5/2006 | Winger et al. |

OTHER PUBLICATIONS

Impress standard textbook series "H.264/AVC textbook," pp. 146-147, Chapter 6: Compression coding devices, key to AVC, with English translation.

* cited by examiner

*Primary Examiner* — Bhavesh Mehta
*Assistant Examiner* — Hadi Akhavannik
(74) *Attorney, Agent, or Firm* — McDermott Will & Emery LLP

(57) ABSTRACT

A first data buffer stores LEVEL representing the size of a non-zero coefficient value of the variable length coded/run length coded data input from the outside. A write controller writes the LEVEL to the first data buffer in decoded order. An initial address calculator calculates the initial address of the LEVEL from the TotalCoeff and the number of zero coefficients of the total_zeros. An address holder determines and holds the address of the LEVEL corresponding to data based on the initial address and the number of zero coefficients by the run_before. A read controller reads the LEVEL from the first data buffer based on the address information. A selector selects the data of either the LEVEL stored in the first data buffer or the zero coefficients based on the address information. A post-stage processor post-stage processes the data selected by the selector.

34 Claims, 41 Drawing Sheets

LAST LEVEL

FIG. 5

TotalCoeff=7 level=-1 ------ (12)
level=+1 ------ (10)
level=-3 ------ (7)
level=+8 ------ (5)
level=+11 ------ (3)
level=-4 ------ (2)
level=+23 ------ (1)
                        ↑— ADDRESS total_zeros=5 run_before=1
run_begore=2
run_before=1
run_before=1
run_before=0
run_before=0

FIG. 17

| 1 | 1 | 0 | 1 |
|---|---|---|---|
| 1 | 1 | 0 | 0 |
| 0 | 0 | 1 | 0 |
| 1 | 0 | 0 | 0 |

(a) STORING POSITION OF FIRST INFORMATION REGISTER 7a

| 1 | 2 | 6 | 7 |
|---|---|---|---|
| 3 | 5 | 8 | 13 |
| 4 | 9 | 12 | 14 |
| 10 | 11 | 15 | 16 |

(b) READING ORDER OF FIRST INFORMATION REGISTER 7a

| +23 | −4 | +11 | +8 | −3 | +1 | −1 |
|---|---|---|---|---|---|---|

(c) STORED DATA OF FIRST DATA BUFFER 4

ADDRESS 1
ADDRESS 2
ADDRESS 3
ADDRESS 4

↑ ↑ ↑ ↑
BANK A  BANK B  BANK C  BANK D (d) BANK CONFIGURATION EXAMPLE OF THIRD DATA BUFFER 17c

| +23 | | | |
|---|---|---|---|
| | | | |
| | | | |
| | | | |

(e) FIRST DATA WRITE TO THIRD DATA BUFFER 17c

| +23 | −4 | | |
|---|---|---|---|
| | | | |
| | | | |
| | | | |

(f) SECOND DATA WRITE TO THIRD DATA BUFFER 17c

| +23 | −4 | | |
|---|---|---|---|
| +11 | | | |
| | | | |
| | | | |

(g) THIRD DATA WRITE TO THIRD DATA BUFFER 17c

| +23 | −4 | | |
|---|---|---|---|
| +11 | +8 | | |
| | | | |
| | | | |

(h) FOURTH DATA WRITE TO THIRD DATA BUFFER 17c

| +23 | −4 | | −3 |
|---|---|---|---|
| +11 | +8 | | |
| | | | |
| | | | |

(i) FIFTH DATA WRITE TO THIRD DATA BUFFER 17c

| +23 | −4 | | −3 |
|---|---|---|---|
| +11 | +8 | | |
| | | | |
| +1 | | | |

(j) SIXTH DATA WRITE TO THIRD DATA BUFFER 17c

| +23 | −4 | | −3 |
|---|---|---|---|
| +11 | +8 | | |
| | | | −1 |
| +1 | | | |

(k) SEVENTH DATA WRITE TO THIRD DATA BUFFER 17c

FIG. 18

| FIRST INFORMATION REGISTER ADDRESS | THIRD DATA BUFFER BANK | THIRD DATA BUFFER ADDRESS | SECOND INFORMATION REGISTER ADDRESS |
|---|---|---|---|
| 1 | BANK A | 1 | 1 |
| 2 | BANK B | 1 | 2 |
| 3 | BANK A | 2 | 5 |
| 4 | BANK A | 3 | 9 |
| 5 | BANK B | 2 | 6 |
| 6 | BANK C | 1 | 3 |
| 7 | BANK D | 1 | 4 |
| 8 | BANK C | 2 | 7 |
| 9 | BANK B | 3 | 10 |
| 10 | BANK A | 4 | 13 |
| 11 | BANK B | 4 | 14 |
| 12 | BANK C | 3 | 11 |
| 13 | BANK D | 2 | 8 |
| 14 | BANK D | 3 | 12 |
| 15 | BANK C | 4 | 15 |
| 16 | BANK D | 4 | 16 |

FIG. 22

| | | | | |
|---|---|---|---|---|
| ADDRESS 1 | A | B | C | D |
| ADDRESS 2 | D | B | A | C |
| ADDRESS 3 | C | B | D | A |
| ADDRESS 4 | A | C | B | D |

FIG. 23

| FIRST INFORMATION REGISTER ADDRESS | THIRD DATA BUFFER BANK | THIRD DATA BUFFER ADDRESS | SECOND INFORMATION REGISTER ADDRESS |
|---|---|---|---|
| 1 | BANK A | 1 | 1 |
| 2 | BANK B | 1 | 2 |
| 3 | BANK D | 2 | 5 |
| 4 | BANK C | 3 | 9 |
| 5 | BANK B | 2 | 6 |
| 6 | BANK C | 1 | 3 |
| 7 | BANK D | 1 | 4 |
| 8 | BANK A | 2 | 7 |
| 9 | BANK B | 3 | 10 |
| 10 | BANK A | 4 | 13 |
| 11 | BANK C | 4 | 14 |
| 12 | BANK D | 3 | 11 |
| 13 | BANK C | 2 | 8 |
| 14 | BANK A | 3 | 12 |
| 15 | BANK B | 4 | 15 |
| 16 | BANK D | 4 | 16 |

FIG. 28B total_zeros = 5    TotalCoeff = 7
level : −1 +1 −3 +8 +11 −4 +23
run_before : 1 2 1 1 0 0

| 16 | 15 | 14 | 13 | 12 | 11 | 10 | 9 |
|---|---|---|---|---|---|---|---|
| 16 | 15 | 14 | 13 | 12 | 11 | 10 | 9 |
| * | * | * | * | −1 | +1 | −3 | +8 |
| 0 | 0 | 0 | 0 | 1 | 0 | 0 | 0 |

| 8 | 7 | 6 | 5 | 4 | 3 | 2 | 1 | |
|---|---|---|---|---|---|---|---|---|
| 8 | 7 | 6 | 5 | 4 | 3 | 2 | 1 | DATA BUFFER ADDRESS |
| +11 | −4 | +23 | 0 | 0 | 0 | 0 | 0 | DATA BUFFER VALUE |
| 0 | 0 | 0 | 0 | 0 | 0 | 0 | 0 | INFORMATION REGISTER VALUE |

← READING ORDER

FIG. 28C total_zeros = 5  TotalCoeff = 7
level : −1 +1 −3 +8 +11 −4 +23
run_before : 1 2 1 1 0 0

| 16 | 15 | 14 | 13 | 12 | 11 | 10 | 9 |
|----|----|----|----|----|----|----|----|
| 16 | 15 | 14 | 13 | 12 | 11 | 10 | 9 |
| *  | *  | *  | *  | −1 | *  | +1 | −3 |
| 0  | 0  | 0  | 0  | 1  | 0  | 1  | 0  |

| 8 | 7 | 6 | 5 | 4 | 3 | 2 | 1 |
|----|----|----|----|----|----|----|----|
| 8 | 7 | 6 | 5 | 4 | 3 | 2 | 1 | DATA BUFFER ADDRESS |
| +8 | +11 | −4 | +23 | 0 | 0 | 0 | 0 | DATA BUFFER VALUE |
| 0 | 0 | 0 | 0 | 0 | 0 | 0 | 0 | INFORMATION REGISTER VALUE |

READING ORDER

FIG. 28D total_zeros = 5    TotalCoeff = 7
level : −1 +1 −3 +8 +11 −4 +23
run_before : 1 2 1 1 0 0

| 16 | 15 | 14 | 13 | 12 | 11 | 10 | 9 |
|----|----|----|----|----|----|----|----|
| 16 | 15 | 14 | 13 | 12 | 11 | 10 | 9 |
| *  | *  | *  | *  | −1 | *  | +1 | * |
| 0  | 0  | 0  | 0  | 1  | 0  | 1  | 0 |

| 8 | 7 | 6 | 5 | 4 | 3 | 2 | 1 | |
|---|---|---|---|---|---|---|---|---|
| 8 | 7 | 6 | 5 | 4 | 3 | 2 | 1 | DATA BUFFER ADDRESS |
| * | −3 | +8 | +11 | −4 | +23 | 0 | 0 | DATA BUFFER VALUE |
| 0 | 1 | 0 | 0 | 0 | 0 | 0 | 0 | INFORMATION REGISTER VALUE |

READING ORDER

FIG. 28E total_zeros = 5  TotalCoeff = 7
level : −1 +1 −3 +8 +11 −4 +23
run_before : 1 2 1 1 0 0

| 16 | 15 | 14 | 13 | 12 | 11 | 10 | 9 |
|----|----|----|----|----|----|----|---|
| 16 | 15 | 14 | 13 | 12 | 11 | 10 | 9 |
| *  | *  | *  | *  | −1 | *  | +1 | * |
| 0  | 0  | 0  | 0  | 1  | 0  | 1  | 0 |

| 8 | 7  | 6 | 5  | 4   | 3  | 2   | 1 |                            |
|---|----|---|----|-----|----|-----|---|----------------------------|
| 8 | 7  | 6 | 5  | 4   | 3  | 2   | 1 | DATA BUFFER ADDRESS        |
| * | −3 | * | +8 | +11 | −4 | +23 | 0 | DATA BUFFER VALUE          |
| 0 | 1  | 0 | 1  | 0   | 0  | 0   | 0 | INFORMATION REGISTER VALUE |

READING ORDER

FIG. 28F total_zeros = 5     TotalCoeff = 7
level : −1 +1 −3 +8 +11 −4 +23
run_before : 1 2 1 1 0 0

| 16 | 15 | 14 | 13 | 12 | 11 | 10 | 9 |
|---|---|---|---|---|---|---|---|
| 16 | 15 | 14 | 13 | 12 | 11 | 10 | 9 |
| * | * | * | * | −1 | * | +1 | * |
| 0 | 0 | 0 | 0 | 1 | 0 | 1 | 0 |

| 8 | 7 | 6 | 5 | 4 | 3 | 2 | 1 | |
|---|---|---|---|---|---|---|---|---|
| 8 | 7 | 6 | 5 | 4 | 3 | 2 | 1 | DATA BUFFER ADDRESS |
| * | −3 | * | +8 | * | +11 | −4 | +23 | DATA BUFFER VALUE |
| 0 | 1 | 0 | 1 | 0 | 1 | 0 | 0 | INFORMATION REGISTER VALUE |

READING ORDER

FIG. 28G total_zeros = 5    TotalCoeff = 7
level : −1 +1 −3 +8 +11 −4 +23
run_before : 1 2 1 1 0 0

| 16 | 15 | 14 | 13 | 12 | 11 | 10 | 9 |
|----|----|----|----|----|----|----|----|
| 16 | 15 | 14 | 13 | 12 | 11 | 10 | 9 |
| *  | *  | *  | *  | −1 | *  | +1 | *  |
| 0  | 0  | 0  | 0  | 1  | 0  | 1  | 0  |

| 8 | 7 | 6 | 5 | 4 | 3 | 2 | 1 |   |
|---|---|---|---|---|---|---|---|---|
| 8 | 7 | 6 | 5 | 4 | 3 | 2 | 1 | DATA BUFFER ADDRESS |
| * | −3 | * | +8 | * | +11 | −4 | +23 | DATA BUFFER VALUE |
| 0 | 1 | 0 | 1 | 0 | 1 | 1 | 1 | INFORMATION REGISTER VALUE |

READING ORDER

FIG. 28H total_zeros = 5    TotalCoeff = 7
level : −1 +1 −3 +8 +11 −4 +23
run_before : 1 2 1 1 0 0

| 16 | 15 | 14 | 13 | 12 | 11 | 10 | 9 |
|----|----|----|----|----|----|----|---|
| 16 | 15 | 14 | 13 | 12 | 11 | 10 | 9 |
| *  | *  | *  | *  | −1 | *  | +1 | * |
| 0  | 0  | 0  | 0  | 1  | 0  | 1  | 0 |

| 8 | 7 | 6 | 5 | 4 | 3 | 2 | 1 |
|---|---|---|---|---|---|---|---|
| 8 | 7 | 6 | 5 | 4 | 3 | 2 | 1 | DATA BUFFER ADDRESS
| * | −3 | * | +8 | * | +11 | −4 | +23 | DATA BUFFER VALUE
| 0 | 1 | 0 | 1 | 0 | 1 | 1 | 1 | INFORMATION REGISTER VALUE

← READING ORDER

VARIABLE LENGTH DECODING DEVICE, VARIABLE LENGTH DECODING METHOD AND IMAGE CAPTURING SYSTEM

BACKGROUND OF THE INVENTION

1. Field of the Invention

The present invention relates to decoding methods and decoding devices for variable length decoding and run length decoding coded data coded using variable length coding and run length coding. In particular, the present invention relates to variable length decoding methods and variable length decoding devices used in image decompression technique of decompressing the compressed image data. The present invention also relates to image capturing system.

2. Description of the Related Art

The compression/decompression method using run length codes and variable length codes is used in JPEG (Joint Photographic Experts Group) and MPEG (Moving Picture Experts Group), which are general compression techniques of image data, and is widely used as a technique that allows data transfer with a small amount of information through widespread use of digital cameras and digital video cameras as well as development in communications technique.

The configuration of a typical image compression device is shown in FIG. 31, and the following description will be made with reference to FIG. 31. Image data is sequentially input after being divided to blocks each having eight by eight pixels in advance. A DCT (Discrete Cosine Transform) unit 101 generates DCT coefficients by frequency transforming the image data with discrete cosine transformation. Since the change in color is usually smooth in a natural image, DCT coefficients of a large value are distributed in a low frequency region m and DCT coefficients of a small value are distributed in a high frequency region n when DCT coefficients are generated through frequency transformation, as shown in FIG. 32. In particular, the coefficient o on the upper left corner is referred to as the DC component that does not have frequency component, and other coefficients are referred to as AC components.

A quantization unit 102 divides a DCT coefficient with a quantization value set in advance to generate a quantization coefficient. According to such process, a coefficient of "0" (zero coefficient) can be concentrated at the high frequency region that does not influence the image quality.

Furthermore, run length data is sequentially generated in a variable length coding unit 103 by combining RUN representing the number of "0" and LEVEL representing the size of a coefficient value in the order of zigzag scan, as shown in FIG. 33. A code word having a different length is then allocated according to the appearance ratio of such combination to reduce the volume of the data.

On the other hand, the image decompression device for decoding the variable length coded data coded by the above configuration includes a variable length decoding unit 104, an inverse quantization unit 105, and an inverse DCT unit 106 corresponding to the image compression device, as shown in FIG. 34.

The variable length decoding unit 104 decodes the variable length coded data as a combination of the RUN representing the number of "0" and the LEVEL representing the size of a coefficient value, generates zero coefficients by the size of the RUN, and combines the generated zero coefficients and the coefficients represented by the LEVEL. This operation is repeated until coefficients are generated for eight by eight pixels. The inverse quantization unit 105 multiples a quantization value set in advance and the generated coefficients for eight by eight pixels together to generate an inverse quantization DCT coefficient. The inverse DCT unit 106 converts the generated inverse quantization DCT coefficients in a frequency region to those in a spatial region to decode as image data.

The configuration of the conventional variable length decoding unit 104 will now be described with reference to FIG. 35. A variable length decoder 108 decodes variable length coded data input from an input section 107 as a combination of the RUN representing the number of "0" and the LEVEL representing the size of a coefficient value. A write controller 109 provides a selection signal to a selector 110 in order for the selector 110 to write "0" to a data buffer 112 by the number of decoded RUN. The selector 110 then writes to the data buffer 112 "0" by the number of RUN. After writing "0", the selector 110 writes coefficients represented by the LEVEL to the data buffer 112. After such operation is repeated for eight by eight pixels, a read controller 111 sequentially reads the data from the data buffer 112 through zigzag scan (FIG. 33), and outputs the read data from an output section 113 to the inverse quantization unit 105.

However, in the conventional configuration, a wasteful time is produced during the period the coefficient or "0" is successively written by the number of RUN because the variable decoder 108 cannot perform any process, which inhibits speed up of the decoding processing.

One solution to such drawback is a decoding circuit of run length codes. One example of its configuration will be described with reference to FIG. 36. In FIG. 36, reference numeral 202 is an input section which inputs variable length coded/run length coded data. Numeral 203 is a variable length decoder which sequentially decodes the data input from the input section 202 as a combination of the RUN representing the number of "0" and the LEVEL representing the size of a coefficient value. Numeral 204 is a data buffer which stores the LEVEL. Numeral 205 is an address adder which computes the address of the LEVEL corresponding to this data based on the number of "0" by RUN. Numeral 206 is an information register of M×N bits which stores the result of the address adder 205. Numeral 207 is a write controller which stores the LEVEL to the data buffer 204 based on the information from the address adder 205. Numeral 208 is a read controller which reads the LEVEL from the data buffer 204 based on the value of the information register 206. Numeral 209 is a selector which selects and outputs either the LEVEL stored in the data buffer 204 or "0" based on the value of the information register 206. Numeral 210 is a post-stage processor which performs post-stage processing on the data from the selector 209. Numeral 211 is an output section which outputs the data from the post-stage processor 210.

When variable length coded/run length coded data is input from the input section 202, the variable length decoder 203 sequentially decodes the input variable length coded/run length coded data as a combination of the RUN representing the number of "0" and the LEVEL representing the size of a coefficient value.

The address adder 205 computes the address based on the size of the decoded RUN in the order of zigzag scan shown in FIG. 33, that is, 1→2→9→17 . . . in the decoded data. The information register 206 successively stores "0" for example, by the size of the RUN in the order of zigzag scan, and stores "1" for example as the address of the LEVEL in the subsequent position. The write controller 207 writes the LEVEL to the address computed by the address adder 205.

The write controller 207 determines whether or not the writing of the LEVEL for one block is terminated, and the process returns to the first step of decoding if determined as not terminated, and the process proceeds to the reading process when determined as terminated. After the combination of the RUN and the LEVEL equivalent to one block is decoded by the variable length decoder 203 and writing of the LEVEL is terminated, the read controller 208 determines the stored content of the information register 206 based on the control signal indicating the permission for reading from the post-stage processor 210, and controls the reading process based on the determination result. That is, the read controller 208 outputs the address equivalent to the bit having "1" stored in the information register 206 to the data buffer 204, and reads the LEVEL stored in the relevant address. In the selector 209, when the determination of the information register 206 is made by the read controller 208, and at the same time, when the bit of the information register 206 is "0", "0" is output to the post-stage processor 210, and the output data LEVEL read from the data buffer 204 is output to the post-stage processor 210 when the bit is "1". The post-stage processor 210 performs post-stage processing on the data received via the selector 209, and outputs the processed data from the output section 211.

According to the prior art, the selector 209 is arranged at the post-stage of the data buffer 204, and only the LEVEL is stored in the data buffer 204 and "0" is not stored therein. Therefore, "0" is selected in the post-stage selector 209. The variable length decoder 203 does not need to stop its operation, which is advantageous in increasing the speed. Furthermore, the variable length decoder of low power consumption can be obtained in a minimum required configuration since the access to the data buffer 204 can be reduced by reading out only the LEVEL based on the information of the holder of the address.

On the other hand, presently, H264 coding method (hereinafter referred to as H.264) is given attention as a compression technique following MPEG 4. FIG. 37 is a typical processing block of H.264, which is configured by four by four pixels. The features of the variable length coding of H.264 lie in that TotalCoeff representing the number of non-zero coefficients in the block, LEVEL representing the size of a non-zero coefficient value, total_zeros representing the number of zero coefficients before the last LEVEL in the data scanning direction, and run_before representing the number of successive zero coefficients before the LEVEL in the data scanning direction are coded, and RUN and LEVEL are not coded as a combination, as opposed to JPEG, MPEG 2, and MPEG 4. H.264 is explained in detail in Impress Co. standard textbook "H.264/AVC textbook".

The information cannot be stored in a information register with the conventional configuration that assumes that the combination of RUN and LEVEL is being decoded since the combination of RUN and LEVEL is not decoded in H.264.

SUMMARY OF THE INVENTION

The primary object of the present invention is thus to provide high efficient variable length decoding devices and variable length decoding methods by enabling writing of data to an information register without a configuration based on the combination of RUN and LEVEL, and reducing processing time in reading.

A variable decoding device of the present invention for achieving the above aim includes, a variable length decoder for sequentially decoding a externally input variable length coded/run length coded data to TotalCoeff representing the number of non-zero coefficients, LEVEL representing the size of a non-zero coefficient value, total_zeros representing the number of zero coefficients before the last LEVEL in the data scanning direction, run_before representing the number of successive zero coefficients before the LEVEL in the data scanning direction;

a first data buffer for storing the LEVEL;

a write controller for writing the LEVEL to the first data buffer in the decoded order;

an initial address calculator for calculating the initial address of the LEVEL from the TotalCoeff and the number of zero coefficients of the total_zeros;

an address holder for determining and holding an address of the LEVEL corresponding to data based on the initial address and the number of zero coefficients by the run_before;

a read controller for reading the LEVEL from the first data buffer based on the address information held by the address holder;

a selector for selecting either the LEVEL stored in the first data buffer or the zero coefficients based on the address information held by the address holder; and a post-stage processor for post-stage processing the data selected by the selector, where a technical feature lies in that the initial address calculator is arranged.

In the above configuration, the address holder may include, an address calculator for calculating the address of the LEVEL corresponding to data based on the initial address and the number of the run_before; and an information register for controlling the selector and the read controller based on the address of the LEVEL calculated by the address calculator and the TotalCoeff.

According to such configuration, writing to the data buffer is reduced by reading the LEVEL from the data buffer based on the address of the address holder (information register). Thus, a variable length decoding device that can respond to H.264 of lower power consumption is achieved.

In the variable decoding device of the above configuration, the write controller may calculate an effective address by sequentially subtracting a value of the total_zeros from an address of the TotalCoeff, and write the effective address to the data buffer. The above configuration may be referenced to FIG. 7 in an embodiment described below.

According to such configuration, a variable length decoding device with a small circuit size can be achieved since the address holder (information register) needs to store only the address of the LEVEL and does not need to store the TotalCoeff.

Regarding the above configuration, one of the preferred aspects is that the configuration is such that the first data buffer alternately stores the LEVEL with K (K is a natural number of greater than or equal to two) banks and simultaneously reads K data based on the value of the information register, and a plurality of data is simultaneously replaced with "0" in the selector.

According to such configuration, a plurality of data is simultaneously read from the data buffer, and in consequence, a high speed variable length decoding device is achieved.

In the above configuration, a bank controller may be further arranged; where the first data buffer and the information register have a plurality of sets of bank configuration; and the bank controller preferably switches among the plurality of banks in each of the information register and the first data buffer. The above configuration may be referenced to FIG. 10 in an embodiment described below.

According to such configuration, the decoding process of the next block can be started without waiting for the reading of the data buffer, and thus a high speed variable length decoding device is achieved.

In the above configuration, a second data buffer for storing the initial address and the run_before is further desirably arranged. The above configuration may be referenced to FIG. 12 in a embodiment described below.

According to such configuration, the next decoding process can be started without waiting for the writing to the information register when decoding of the run_before is performed at high speed, and thus a high speed variable length decoding device is achieved.

In the above configuration, the bank controller desirably provides a clock only to banks selected in the information register and the plurality of data buffers.

According to such configuration, the provision of clock to unused banks can be limited, and thus a variable length decoding device of lower power consumption is achieved.

In the above configuration, a third data buffer for storing the stored data of the first data buffer;

a second write controller for controlling writing to the third data buffer in conjunction with the operation of the read controller;

a second information register for receiving the same register values as those of the information register through the second write controller and storing them; and a second read controller for controlling the reading of the third data buffer based on register values stored in the second information register are further arranged; wherein the selector selects and outputs one of the LEVEL stored in the third data buffer or the zero coefficient based on the register value stored in the second information register; and the post-stage processor preferably post-stage processes the data selected by the selector.

The above configuration may be referenced to FIG. 14 in an embodiment described below. The feature lies in that a third data buffer is arranged in the next stage of the first data buffer, and a selector is arranged in the next further stage. According to such configuration, only the LEVEL is transferred between the first data buffer and the third data buffer, and in consequence, a higher speed of the variable length decoding process is achieved.

In the above configuration, the third data buffer is configured by a plurality of data buffer rows or data buffer columns;

the second write controller writes data read from the first data buffer to an address position of the third data buffer different from an address position in the first data buffer and stores the data storing address in the third data buffer to the second information register; and the second read controller preferably simultaneously reads the plurality of data from the third data buffer based on the stored information of the second information register.

According to such configuration, the output to the post-stage processor in the order different from the decoding scanning order is made possible, and the scan conversion in the post-stage processor are unnecessary. Accordingly, the speed of the overall decoding process increases.

In the above configuration, the third data buffer can change the array of the plurality of the data buffer rows or the data buffer columns; and the second write controller preferably simultaneously writes the plurality of data read from the first data buffer to the third data buffer.

In the above configuration, the third data buffer is configured by a bit enable controllable memory, the second write controller writes the data read from the first data buffer to an address position of the third data buffer different from an address position in the first data buffer, and stores the data storing address in the third data buffer to the information register; and the second read controller preferably simultaneously reads the plurality of data from the third data buffer based on the information of the information register.

According to such configuration, the second information register is made unnecessary, and a plurality of data is transferred between the first data buffer and the third data buffer, and thus a higher speed of the variable length decoding process is achieved.

Furthermore, it is desirable that scan information is input to the second write controller, and a writing address of the third data buffer may be changed by the scan information. Moreover, the post-processing processor is an inverse quantization processor.

According to such configuration, the third data buffer can be shared with MPEG 4 etc. having different scanning modes, and thus a decoder that can respond to a plurality of coding modes with a small circuit size is achieved.

A variable length decoding device of the present invention further relates to a variable length decoding device for decoding variable length coded/run length coded data; the variable length decoding device comprising:

a variable length decoder for sequentially decoding externally input variable length coded/run length coded data to TotalCoeff representing the number of non-zero coefficients, LEVEL representing the size of a non-zero coefficient value, total_zeros representing the number of zero coefficients before the last LEVEL in the data scanning direction, run_before representing the number of successive zero coefficients before the LEVEL in the data scanning direction;

a first data buffer for storing the LEVEL;

a write controller for writing the LEVEL to the first data buffer in the decoded order;

an initial address calculator for calculating the initial address of the LEVEL from the TotalCoeff and the number of zero coefficients of the total_zeros;

an address holder for determining and holding the address of the LEVEL corresponding to data based on the initial address and the number of zero coefficients by the run_before;

a data shift controller for shifting the LEVEL to the address position corresponding to on the initial address and the number of zero coefficients by the run_before based the data;

a read controller for reading the LEVEL from the first data buffer based on address information held by the address holder;

a selector for selecting either the LEVEL stored in the first data buffer or the zero coefficients based on address information held by the address holder; and a post-stage processor for post-stage processing the data selected by the selector.

Such configuration may be referenced to FIG. 26 in a embodiment described below. The technical features lie in that a data shift controller is arranged.

The features include data shifting the data in the data buffer in advance and lining the data at the same position as the address holder. According to such configuration, the LEVEL can be read from the data buffer through an easily controllable reading method that does not require the calculation of the reading address based on the address holder. The writing to the data buffer is thereby reduced. The variable length decoder responding to H.264 of lower power consumption is thereby achieved.

In order to achieve the above aim, a variable length decoding method of the present invention provides a variable length decoding method for decoding variable length coded/run length coded data; the variable length decoding method including the steps of:

an acquiring step for acquiring the variable length coded/run length coded data;

a decoding step for sequentially decoding TotalCoeff representing the number of non-zero coefficients, LEVEL representing the size of a non-zero coefficient value, total_zeros representing the number of zero coefficients before the last non-zero coefficient in the data scanning direction, run_before representing the number of successive zero coefficients before a non-zero coefficient in the data scanning direction from the acquired variable length coded/run length coded data;

a storing step for storing the LEVEL in a first data buffer;

a calculation step for calculating the initial address of the LEVEL from the number of non-zero coefficients of the TotalCoeff and the number of zero coefficients of the total_zeros;

a determining step for determining the address of the non-zero coefficients corresponding to data based on the initial address and the number of zero coefficients by the run_before;

a reading step for reading the LEVEL from the data buffer based on the address of the non-zero coefficients;

a selecting step for selecting either the LEVEL stored in the first data buffer or the zero coefficients based on the address of the non-zero coefficients; and a post-stage processing step for post-stage processing the selected data.

According to such method, the operation of the reading of data and the selection of output from the selector can be controlled by determining the value (address) determined in the determining step. Accordingly, the writing to the data buffer is reduced, and a variable length decoding method suited to H.264 of lower power consumption is obtained.

In the variable length decoding method of the above configuration, the method further includes another storing step for storing the LEVEL read from the data buffer to another data buffer;

another reading step for providing an information register for controlling the selecting step and the reading step based on the address of the LEVEL and the TotalCoeff, and reading the LEVEL from said another data buffer based on a value of the information register; and another selection step for selecting either the LEVEL stored in said another data buffer or the zero coefficient based on a value of the information register; wherein It is desirable that said another storing step executes the process if said another data buffer is writable.

According to such method, the data of the data buffer can be output without waiting for the post-stage process, and thus the next decoding process can be performed, thereby speeding up the decoding process.

In the above variable length decoding method, the method further includes another storing step for storing the data selected from among the LEVEL stored in the data buffer and the non-zero coefficient to another data buffer;

another reading step for reading the data from another data buffer; and another post-processing step for post-processing the data read from another data buffer; wherein It is desirable that said another storing step executes the process if said another data buffer is writable.

According to such method, the access to the data buffer is facilitated since the address calculation of said another data buffer is unnecessary.

A variable length decoding method of the present invention further includes the step of converting the writing address of the information register based on externally input scan information; wherein It is desirable that storing step stores the LEVEL to said another data buffer after converting the LEVEL to a predetermined scanning order based on the scan information.

According to such method, the present invention is realized in the variable length decoding method having a plurality of scanning modes such as MPEG 4 in addition to H.264.

A first image capturing system of the present invention includes an image processing circuit, having any one of the variable length decoding devices described above for performing image processing; a sensor for outputting an image signal to the image processing circuit; and an optical system for imaging light to the sensor. According to such configuration, a higher speed of the image processing can be expected as a result of high speed execution of the variable length decoding.

A second image capturing system of the present invention further includes a converter for converting an image signal obtained from the sensor to a digital signal and providing the digital signal to the image processing circuit in the first image capturing system. Such configuration exhibits the advantages of digital signal processing.

According to the present invention, writing to the information register becomes possible in a way other than the combination of RUN and LEVEL by arranging the initial address calculator, and only the data other than zero can be read by grasping the information on the data stored in the data buffer by means of the address holder (a combination of an address calculator and an information register). Accordingly, the reading time is reduced, the speed of the variable length decoding process is increased as a whole, and further reduction in power consumption is realized.

Furthermore, according to the present invention, writing to the information register becomes possible without a configuration having the combination of RUN and LEVEL by the initial address calculator, and only the data other than zero is read by grasping the information on the data stored in the data buffer by means of the address holder (a combination of address calculator and an information register), and thus the reading time is reduced, the speed of the variable length decoding process is increased as a whole, and further reduction in power consumption is realized.

As described above, variable length decoding devices and variable length decoding methods of the present invention enable reading only the data other than zero by grasping the information on the data stored in the data buffer by means of the address holder. Therefore, the reading time is reduced, and the speed of the variable length decoding process is increased as a whole. Moreover, since lower power consumption is realized, application to image decoding system etc. in which high speed decoding process is demanded becomes possible.

In particular, devices useful in portable telephones with s camera or DSC installed with H.264, which is recently given attention as a low bit rate coding technique, is obtained.

BRIEF DESCRIPTION OF THE DRAWINGS

Other and further objects of the present invention will become obvious upon an understanding of the illustrative embodiments to be described hereafter and will be indicated in the appended claims, and various advantages not referred to herein will occur to one skilled in the art upon employment of the invention in practice.

FIG. 5 is the decoded data in the actual example of FIG. 3;

FIG. 17 is an explanatory view of the configuration of the third data buffer and an address conversion example using the actual example of FIG. 3 according to the third embodiment;

FIG. 18 is an explanatory view of an address conversion table example according to the third embodiment;

FIG. 22 is an explanatory view of a bank configuration example according to the fourth embodiment using the actual example of FIG. 3;

FIG. 23 is an explanatory view of an address conversion table example according to the fourth embodiment;

FIGS. 28A to 28H are data transition examples in the sixth embodiment;

DETAILED DESCRIPTION OF THE INVENTION

The embodiments of the variable length decoding device according to the present invention will now be described based on the drawings.

First Embodiment

Figure 1:
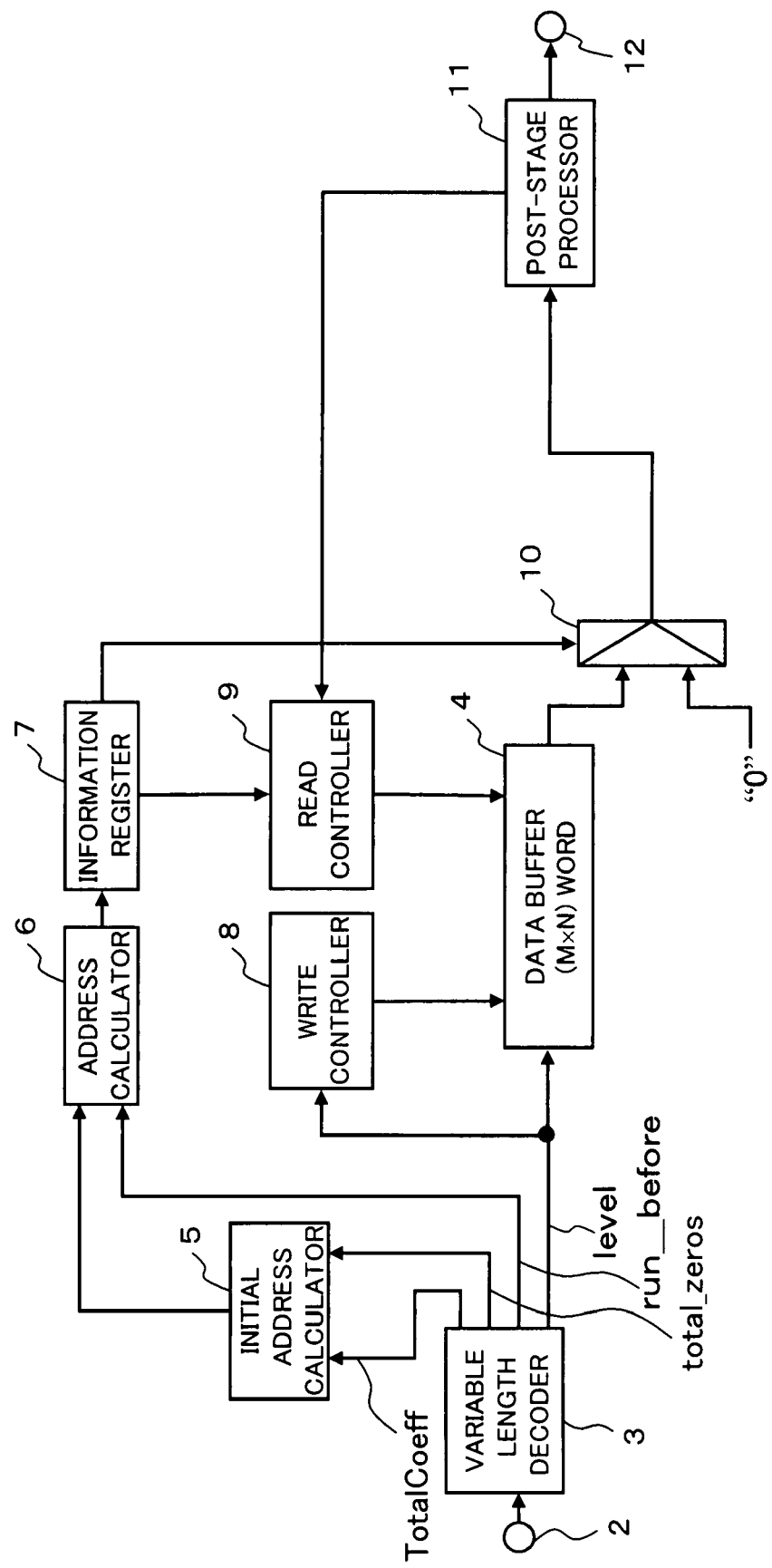
FIG. 1 is a block diagram showing a configuration of a variable length decoding device according to a first embodiment of the present invention.

A variable length decoding device of the first embodiment of the present invention will now be described with reference to the drawings. FIG. 1 shows a schematic configuration of the variable length decoding device according to the first embodiment of the present invention. A case in which the data of one block is divided into four by four will be described in the present embodiment.

In FIG. 1, reference number 2 indicates an input section; 3 indicates a variable length decoder; 4 indicates a data buffer; 5 indicates an initial address calculator; 6 indicates an address calculator; 7 indicates an information register; 8 indicates a write controller; 9 indicates a read controller; 10 indicates a selector; 11 indicates a post-stage processor; and 12 indicates an output section.

The input section 2 inputs variable length coded/run length coded data. The variable length decoder 3 extracts and sequentially decodes TotalCoeff representing the number of non-zero coefficients, LEVEL representing the size of a non-zero coefficient value, total_zeros representing the number of zero coefficients before the last LEVEL in the data scanning direction, and run_before representing the number of successive zero coefficients before the LEVEL in the data scanning direction from the data input from the input section 2. The data buffer 4 stores the LEVEL. The initial address calculator 5 calculates the initial address from the TotalCoeff and the total_zeros. The calculator 6 computes the address of the LEVEL corresponding to data based on the initial address and the number of zero coefficients by the run_before. The information register 7 is an information register of M×N bits+x bits that stores the calculation result of the address calculator 6 and the TotalCoeff. The write controller 8 sequentially writes the LEVEL to the data buffer 4. The read controller 9 reads the LEVEL from the data buffer 4 based on the value of the information register 7. The selector 10 selects and outputs either the LEVEL stored in the data buffer 4 or the zero coefficients based on the value of the information register 7.

The post-stage processor 11 performs post-stage processing on the data from the selector 10. The output section 12 outputs to the outside the data output by the post-stage processor 11.

Figure 2:
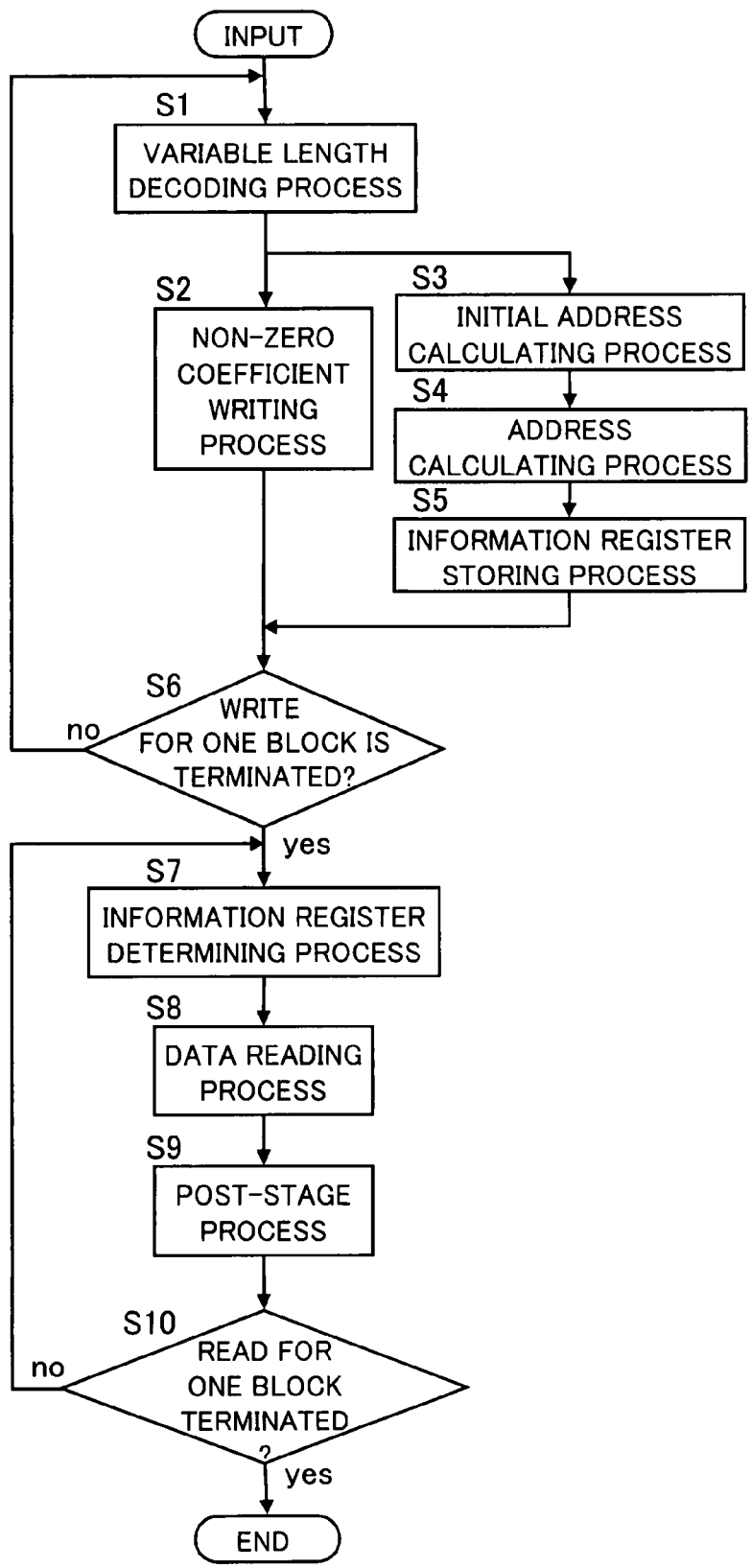
FIG. 2 is a flowchart showing the operation of the variable length decoding device according to the first embodiment of the present invention.

FIG. 2 is a flowchart of the process in the variable length decoding device of the first embodiment of the present invention. The flow of the process will now be described according to FIG. 2. First, when variable length coded/run length coded data is input from the input section 2, the variable length decoder 3 sequentially decodes TotalCoeff representing the number of non-zero coefficients, LEVEL representing the size of a non-zero coefficient value, total_zeros representing the number of zero coefficients before the last LEVEL in the data scanning direction, and run_before representing the successive number of zero coefficients before the LEVEL in the data scanning direction (step S1).

Figures 3, 4:
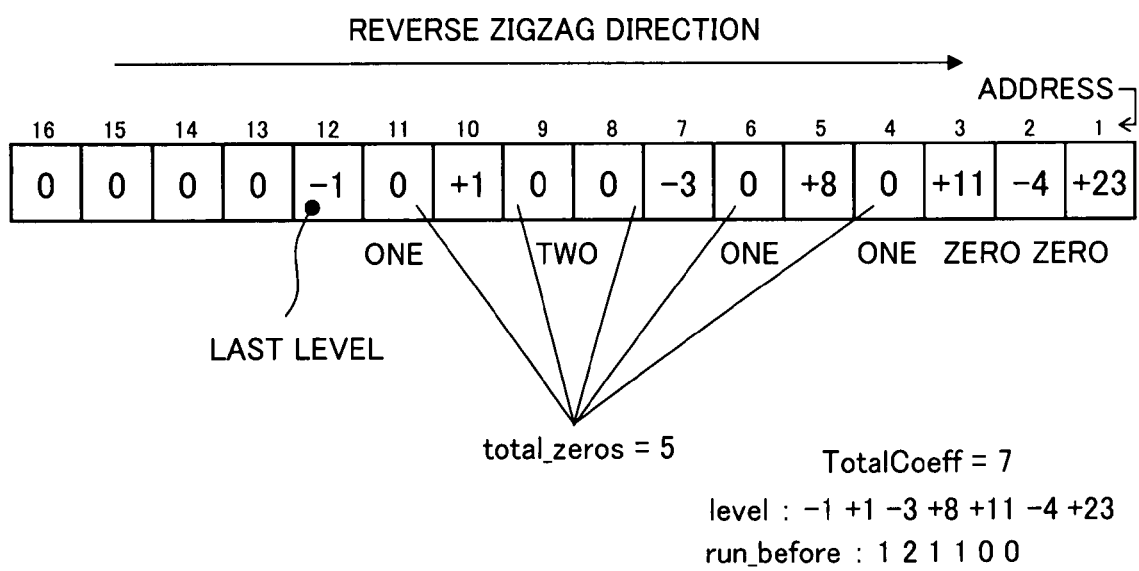
FIG. 3 is an explanatory view of the actual example of block data and reverse zigzag scan.
FIG. 4 is a one-dimensional explanatory view of block data.
Figures 33, 34:
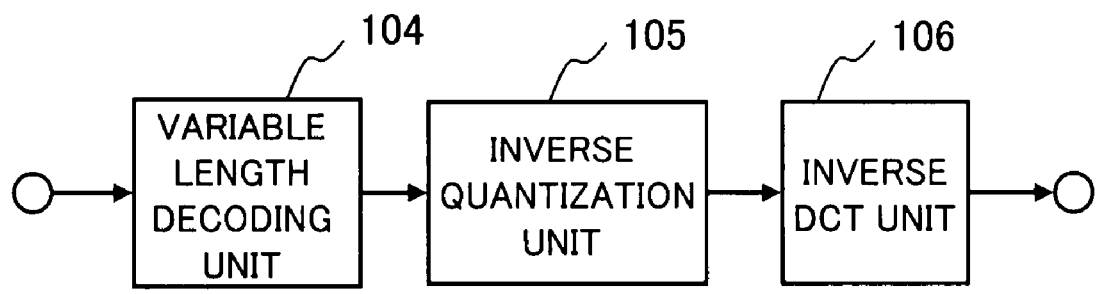
FIG. 33 is an explanatory view of a quantization DCT coefficient after decoding and zigzag scan.
FIG. 34 is a block diagram showing a configuration of a typical image decoding device.
Figure 35:
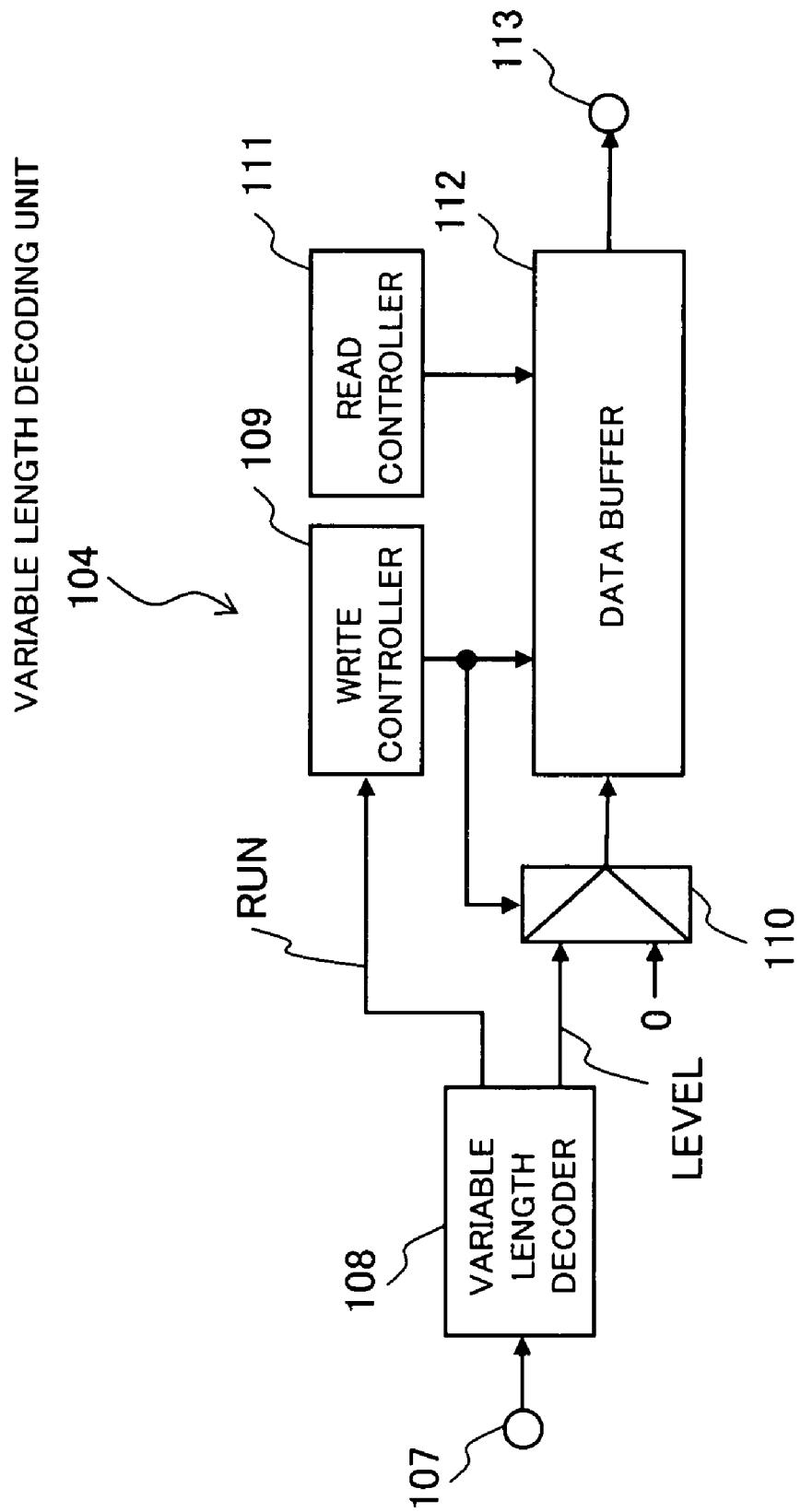
FIG. 35 is a block diagram showing a variable length decoding unit in the prior art.
Figure 36:
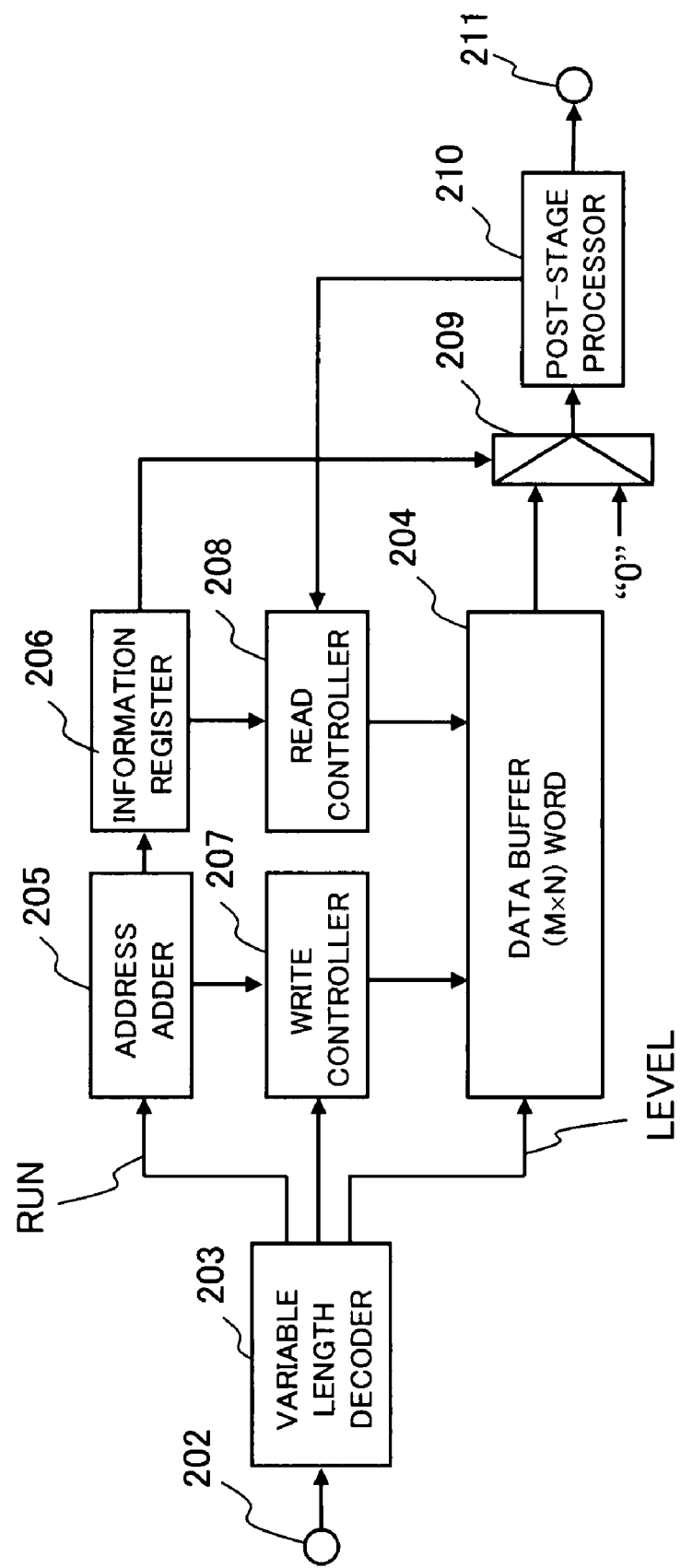
FIG. 36 is a block diagram showing a decoding circuit of run length codes in the prior art.
Figure 37:
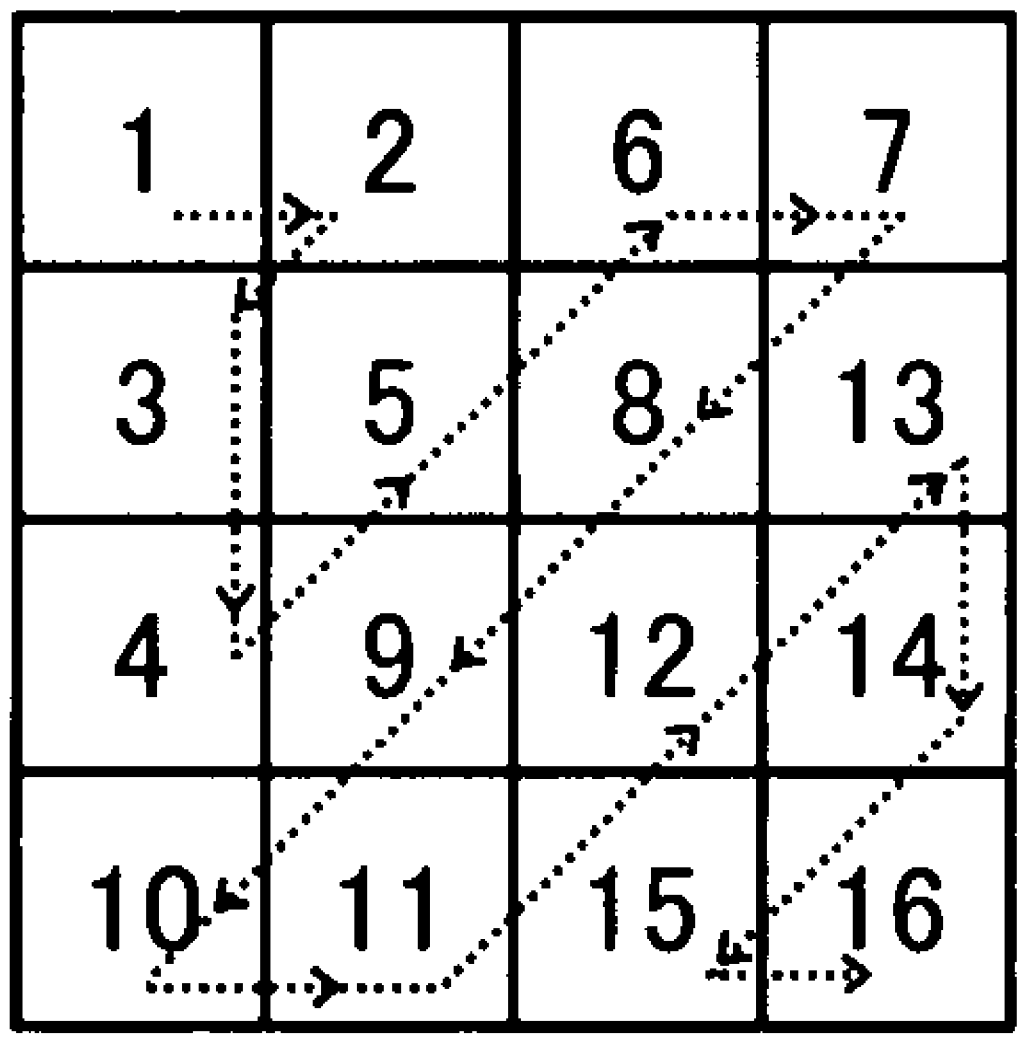
FIG. 37 is an explanatory view of block configuration and zigzag scan in H.264.

An example of sequential decoding is shown in FIG. 3. FIG. 3 is an example in which the actual numbers are entered into the block of FIG. 33. In decoding, the data is decoded in the reverse order of the zigzag scan. FIG. 4 shows the four by four block data of FIG. 3 lined in the reverse order of the zigzag scan. FIG. 5 shows a decoding example in step S1 of the example shown in FIG. 3.

First, TotalCoeff=7 or the number of non-zero coefficients (+23, −4, +11, +8, −3, +1, −1) of the 16 data are decoded. Next, the LEVEL representing the size of the non-zero coefficient is sequentially decoded in the order of reverse zigzag scan, −1→+1→−3→+8→+11→−4→+23. Next, the total number of "0" existing before the last LEVEL=−1 in the zigzag scanning order or total_zeros=5 is decoded. Finally, the number of "0" existing before the last LEVEL or run_before is sequentially decoded in the order of reverse zigzag scan 1→2→1→1→0→0.

The following results are obtained in the decoded data:
The number of "0" existing before LEVEL=−1 is 1;
The number of "0" existing before LEVEL=+1 is 2;
The number of "0" existing before LEVEL=−3 is 1;
The number of "0" existing before LEVEL=+8 is 1;
The number of "0" existing before LEVEL=+11 is 0 (non-existent);
The number of "0" existing before LEVEL=−4 is 0;
The number of "0" existing before LEVEL=+23 is 0.

The run_before becomes 1→2→1→1→0→0 in the order of reverse zigzag scan based on such result. Furthermore, the decoded LEVEL is sequentially written to the data buffer (step S2).

The initial address is calculated from the decoded TotalCoeff and total_zeros (step S3). In the example shown in FIG. 5, TotalCoeff=7 and total_zeros=5 are added to obtain the initial address=12.

Furthermore, the value in which "1" is added to the run_before is subtracted from the initial address=12 in the order of reverse zigzag scan shown in FIG. 3 in the address calculator 6 based on the size of the decoded run_before. That is, in the example shown in FIG. 5, the address is calculated in the order of 12-+10→7→5→3→2→1 (step S4). The run_before is 1→2→1→1→0→0.

That is, since the initial address is 12,
when the value in which "1" is added to the value "1" of the first run_before is subtracted from the initial address "12", the address becomes "10";
when the value in which "1" is added to the value "2" of the second run_before is subtracted from the calculated address "10", the address becomes "7";
when the value in which "1" is added to the value "1" of the third run_before is subtracted from the calculated address "7", the address becomes "5";
when the value in which "1" is added to the value "1" of the fourth run_before is subtracted from the calculated address "5", the address becomes "3";
when the value in which "1" is added to the value "0" of the fifth run_before is subtracted from the calculated address "3", the address becomes "2"; and
when the value in which "1" is added to the value "0" of the sixth run_before is subtracted from the calculated address "2", the address becomes "1".

The address of 12→10→7→5→3→2→1 each corresponds to −1→+1→−3→+8→+11→−4→+23 of the LEVEL.

In the information register 7, "1", for example, is stored for the calculated address as the address of the LEVEL and "0", for example, is stored for the remaining of the block, and the value of TotalCoeff is stored as the data buffer reading initial address (step S5).

In the example shown in FIG. 4, the region of non-zero coefficients is stored as "1" and the TotalCoeff="7" is stored as the data buffer reading initial address. Determination is made on whether the address calculation for one block is terminated, and if not yet terminated, the process returns to step S1, and if terminated, the process proceeds to the reading process (step S6).

Figure 6:
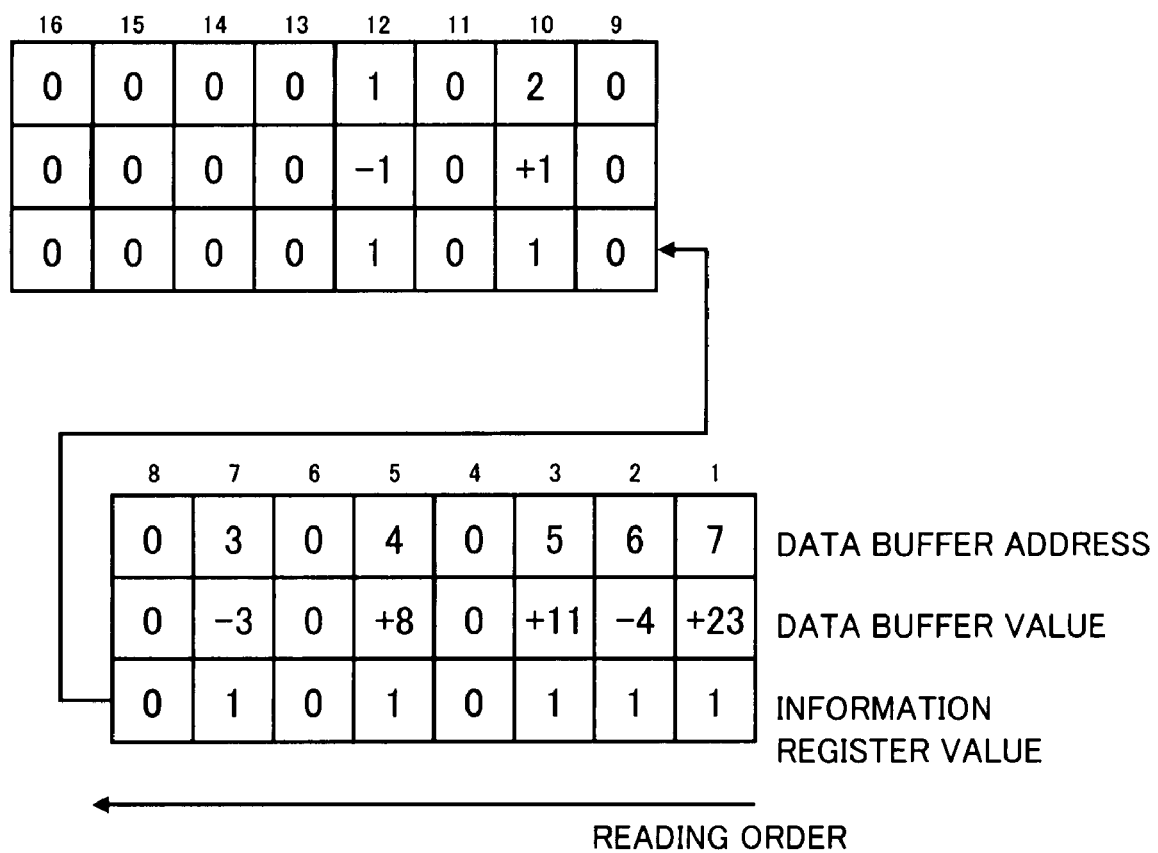
FIG. 6 is an explanatory view of address transition in the device of FIG. 1 using the actual example of FIG. 3.

After data equivalent to one block is decoded by the variable decoder 3 and address calculation is performed (Yes in step S6), the read controller 9 determines the recorded content of the information register 7 in response to the control signal indicating the permission to read from the post-stage processor 11 (step S7). If determined that "1" is stored in the information register 7 in step S7, the data buffer reading initial address is subtracted to generate an address, and the generated address is transmitted to the data buffer 4. The LEVEL stored at the address in the data buffer 4 is thereby read (step S8). The transition shown in FIG. 6 is transition of the address.

The data buffer address is decremented in the reading order (7→6→5→4→3→2→1). Simultaneously with the read controller 9 determining the information register 7, the selector 10 performs the following process. The selector 10 outputs "0" to the post-stage processor 11 when the bit of the information register 7 is "0". In contrast, the selector 10 outputs the output data LEVEL from the data buffer 4 to the post-stage processor 11 when the bit of the information register 7 is "1" (step S8). The post-stage processor 11 performs post-stage processing on the data provided from the selector 10 (step S9), and outputs the processed data from the output section 12 (step S10).

[Writing to Data Buffer]

Figure 7:
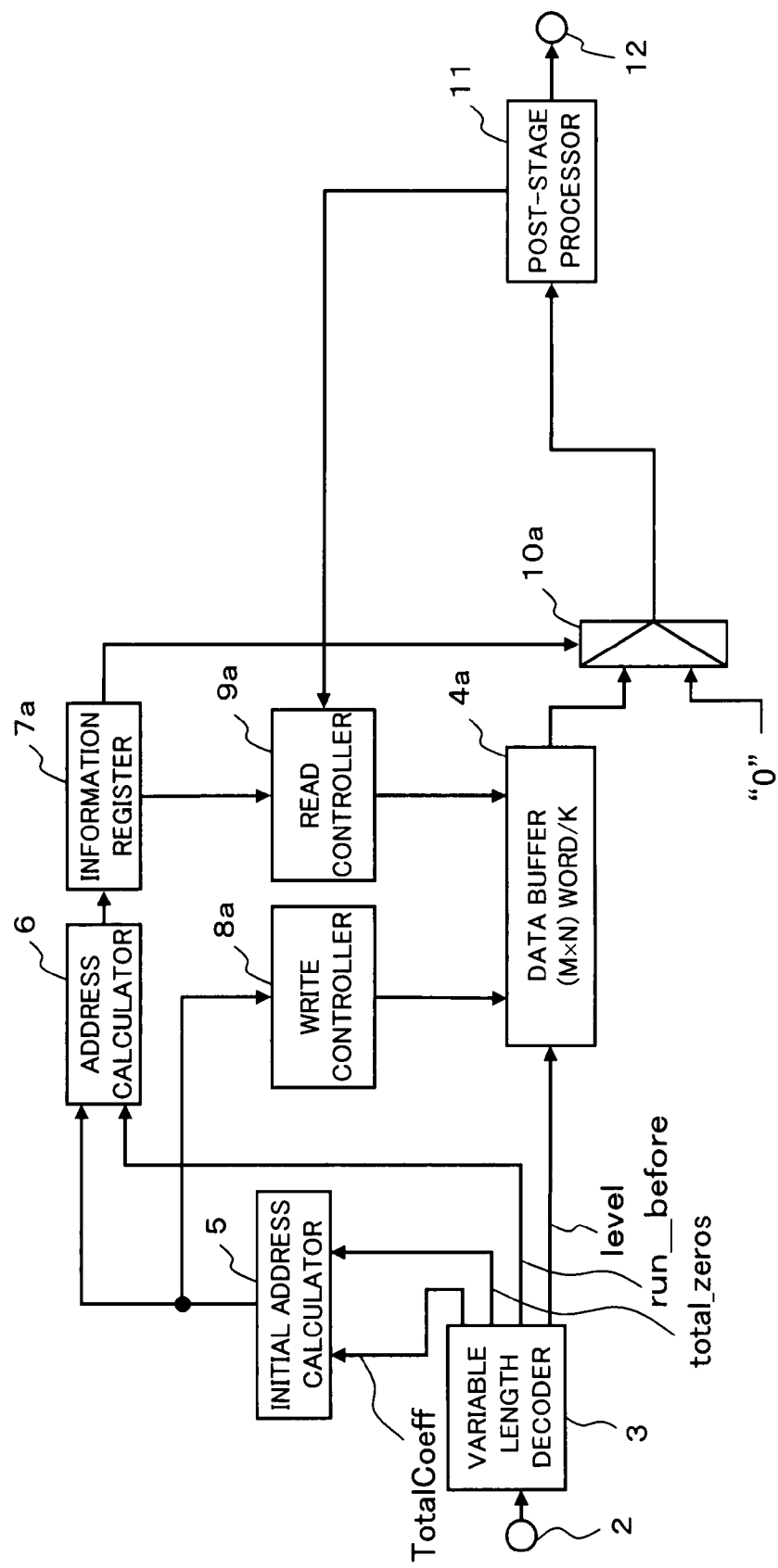
FIG. 7 is a block diagram showing a configuration of the variable length decoding device according to the first embodiment of the present invention (K divided data buffer)

In the present embodiment, the write controller 8a sequentially subtracts the value of TotalCoeff to generate the data to write into the data buffer 4a, as shown in FIG. 7. The information register 7a thus does not need to store the data buffer reading initial address, and can be configured by M×N bits. As shown in the read control example of FIG. 8, the read controller 9a adds the address in order from address 1 for every information register. The data buffer address is thus incremented (1→2→3→4→5→6→7) in the reading order.

[Data Buffer Configuration]

Figure 9:
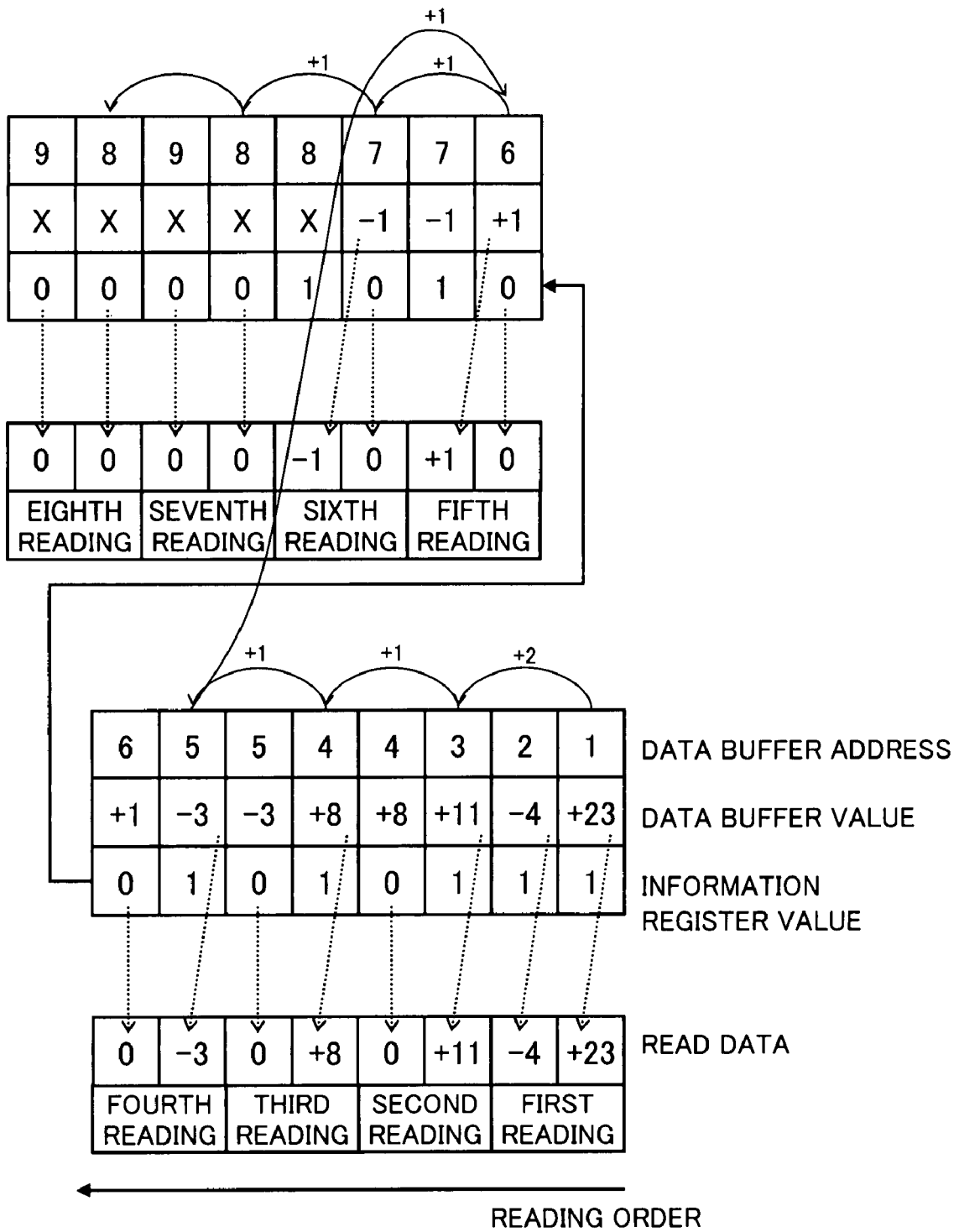
FIG. 9 is an explanatory view of address transition in reading two coefficients in the device of FIG. 7 using the actual example of FIG. 3.

In the present embodiment, the data buffer 4a may have a K bank configuration, as shown in FIG. 7. The information register 7a simultaneously reads a plurality of data through the read controller 9a, and the selector 10a simultaneously replaces the plurality of data with "0". If K=2, the LEVEL is alternately stored in the odd number address bank and the even number address bank. FIG. 9 is a reading example when K=2. Reading is performed from the initial address 1 in the first reading. That is, "+2" is read from the odd number address 1 and "−4" is read from the even number address 2. In this case, "1" is written to both the former and the latter data in the information register 7, and thus "+23" and "−4" become the read data as they are. Therefore, two coefficients are read, and "3", which is obtained by adding "2" to the initial address 1, becomes the second reading start address. In the second reading, "+11" is read from the odd number address 3, and "+8" is read from the even number address 4. Looking at the information register 7, "1" is written only to the former data and the latter data is replaced by "0". That is, "+11", "0" become the second read data. Since one coefficient is read, "4", which is obtained by adding "1" to the address 3, becomes the third reading start address. In the third reading, "+8" is read from the even number address 4, and "−3," is read from the odd number address 5. Looking at the information register 7, "1" is written only to the former data and the latter data is replaced by "0". That is, "+8", "0" become the third read data. Since one coefficient is read, "5", which is obtained by adding "1" to the address 4, becomes the fourth reading start address. In the fourth reading, "−3" is read from the odd number address 5, and "+1" is read from the even number address 6. Looking at the information register 7, "1" is written only to the former data and the latter data is replaced by "0". That is, "−3", "0" become the fourth read data. Since one coefficient is read, "6", which is obtained by adding "1" to the address 5, becomes the fifth reading start address. In the fifth reading, "+1" is read from the even number address 6, and "−1" is read from the odd number address 7. Looking at the information register 7, "1" is written only to the latter data and thus the former data is replaced by "0" and "+1" is output as the latter data. That is, "0", "+1" become the fifth read data. Reading is continued until the eight reading in the same manner.

The present embodiment configured as above has the following advantages. The information register 7 can now be utilized for the variable length coded data of H.264, which could not be responded in the prior art, by arranging the initial address calculator 5.

Furthermore, the LEVEL is stored in the data buffer 4 in the reverse order from the output order in the write controller 8, and thus the information register 7 does not need to store the initial address to read the data buffer, which leads to miniaturization of the circuit size. Moreover, simultaneous reading of K data from the data buffer 4 is realized by configuring the data buffer 4 as K bank configuration, thereby achieving higher speed.

Second Embodiment

Figure 10:
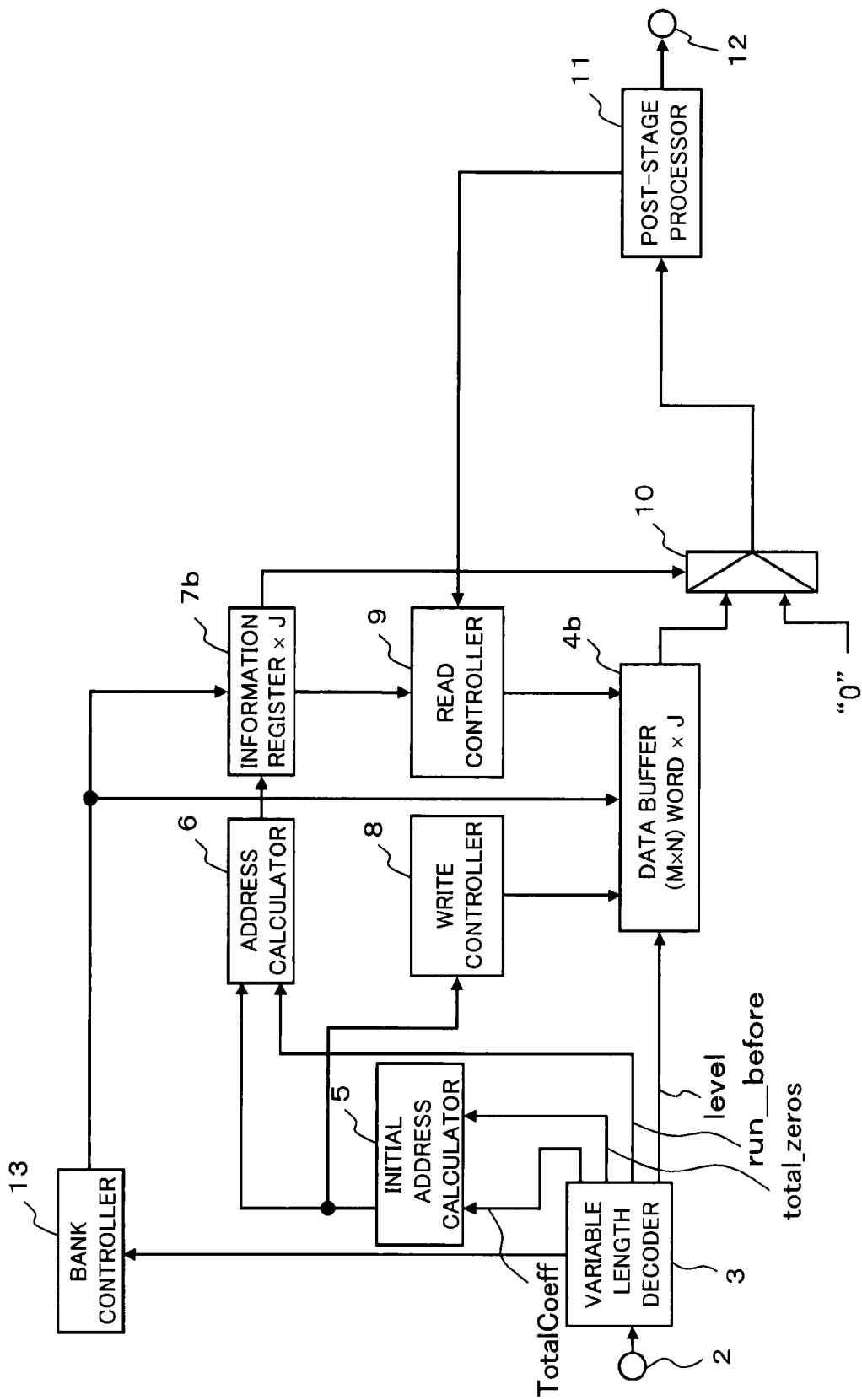
FIG. 10 is a block diagram showing a configuration of a variable length decoding device according to a second embodiment of the present invention.

The variable length decoding device according to the second embodiment will now be described with reference to the figures. FIG. 10 shows a schematic configuration of the variable length decoding device in the second embodiment of the present invention. For the sake of convenience of the explanation, the same reference characters are denoted for the some configurations as in the first embodiment, and the description thereof will be partially omitted. The variable length decoding device has a bank controller 13 added to the variable length decoding device of the first embodiment, and a data buffer 4b and a information register 7b have a J bank configuration (J is a natural number greater than or equal to 2).

Figure 11:
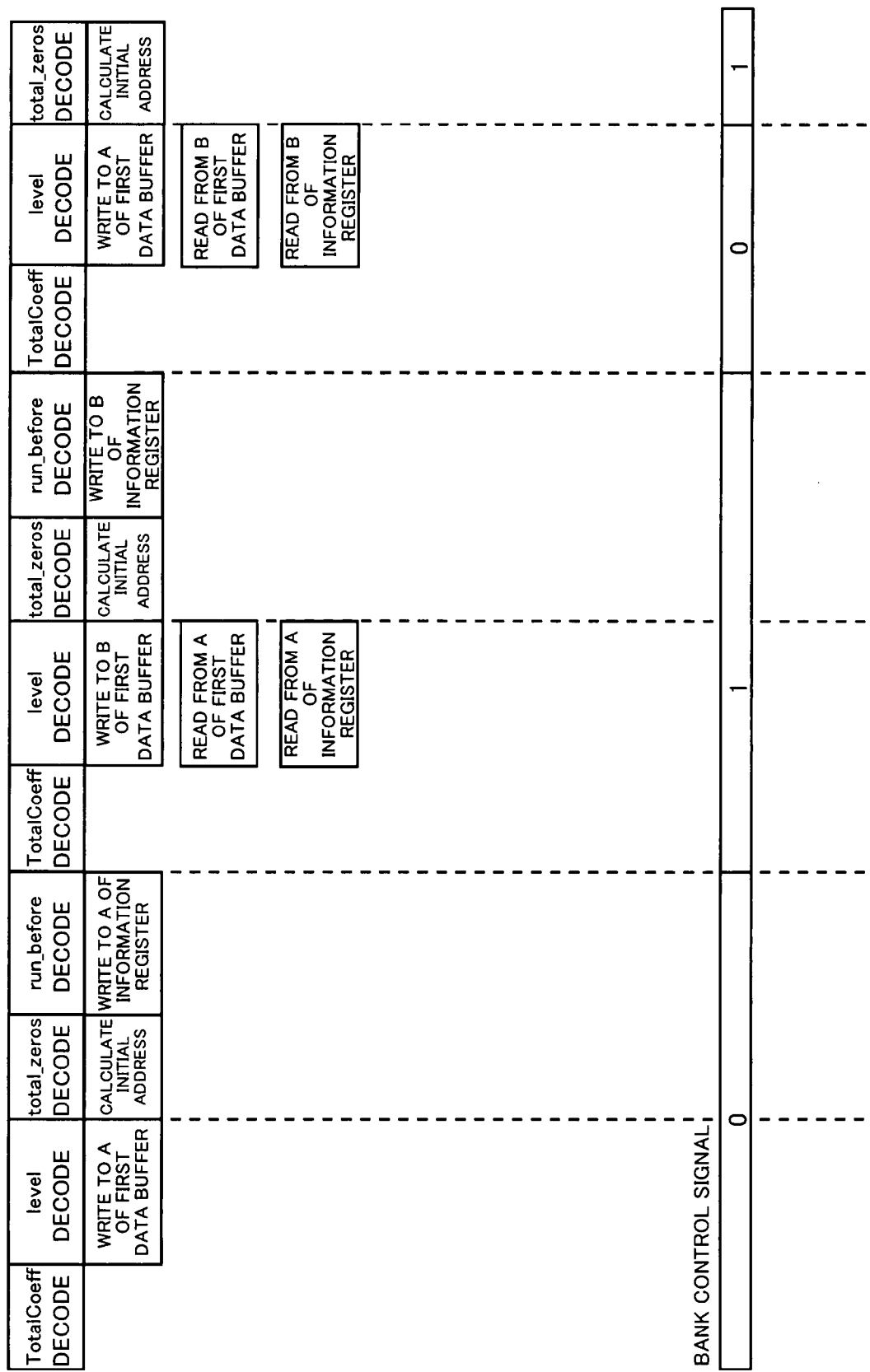
FIG. 11 is a process flowchart according to the second embodiment of the present invention.

The operation of the variable length decoding device of the second embodiment will now be described with reference to the drawings. FIG. 11 is an example of data flow in the variable length decoding device of FIG. 10. The two bank configuration of J=2 will be explained by way of example.

The initial value of the bank control signal from the bank controller 13 is assumed as "0", where "0" indicates bank A and "1" indicates bank B. In decoding the LEVEL of the processing for the first block, the LEVEL is written to bank A of the data buffer 4b. In decoding run_before, LEVEL is written to bank A of the information register 7b. The bank control signal is then set to "1". In the processing of the second block, LEVEL is written to bank B of the data buffer 4b when decoding the LEVEL and the LEVEL is written to bank B of the information register 7b when decoding the run_before. In the processing of the second block, the reading process of the data buffer 4b is performed. In reading, the data of the opposite bank indicated by the bank control signal is read. That is, since the bank control signal indicates "1", bank A of the data buffer 4b is read based on the value of bank A of the information register 7b as the data of the first block.

[Second Data Buffer]

Figure 12:
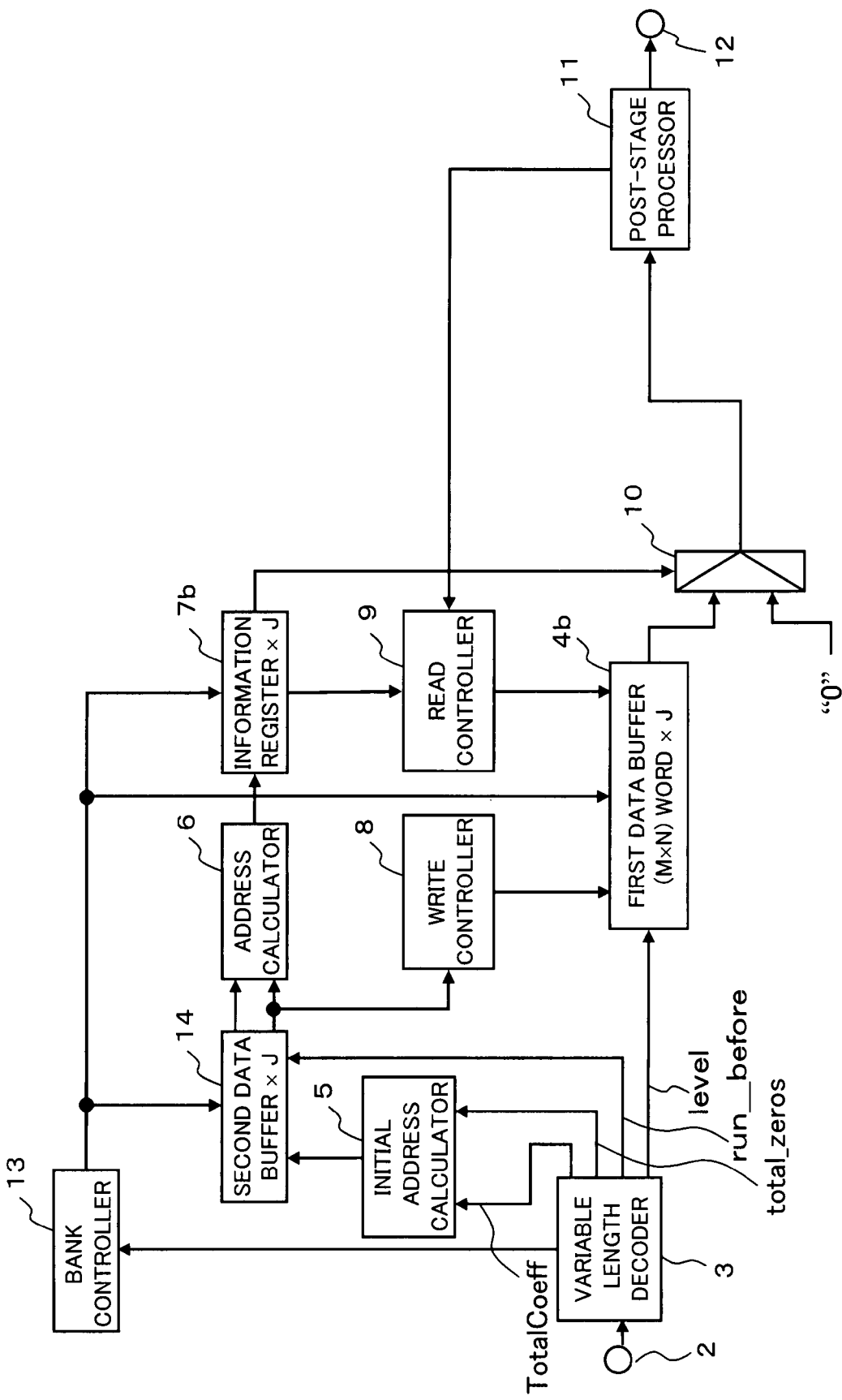
FIG. 12 is a block diagram showing a configuration of a variable length decoding device according to a second embodiment of the present invention (a second data buffer)

In the present embodiment, a second data buffer 14 may be arranged, as shown in FIG. 12. In this case, TotalCoeff, the calculation result of the initial address calculator 5, and run_before are stored in the second data buffer 14. The data is output from the second data buffer 14 to the address calculator 6 and the write controller 8.

Figure 13:
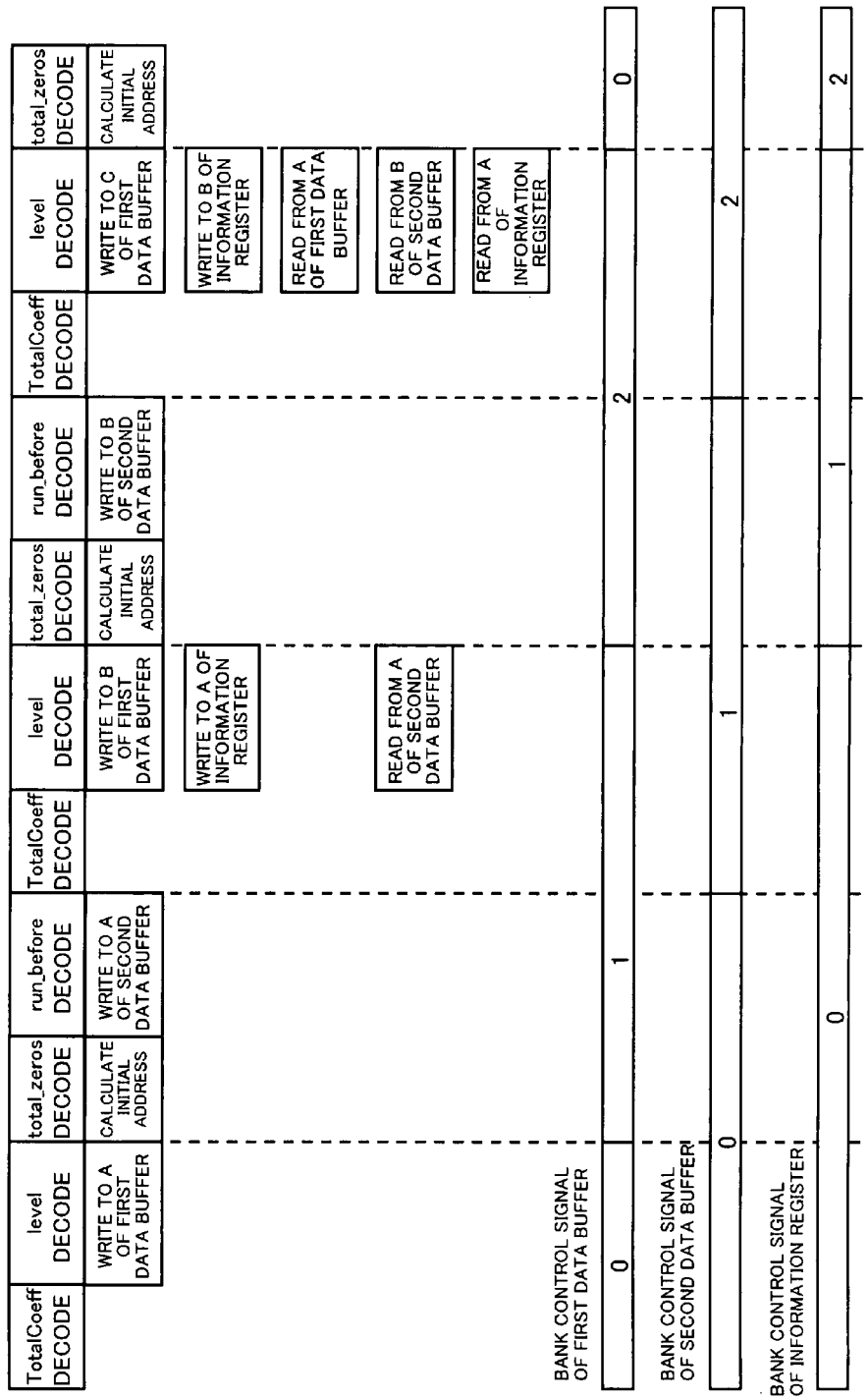
FIG. 13 is a process flowchart according to the second embodiment of the present invention (the second data buffer)

FIG. 13 is an example of data flow in the variable length decoding device of FIG. 12. The three bank configuration of J=3 will be described by way of example. The initial value of the bank control signal from the bank controller 13 is assumed "0", where "0" indicates bank A, "1" indicates bank B and "2" indicates bank C. In the processing of the first block, LEVEL is written to bank A of the first data buffer 4b when decoding the LEVEL. The total_zeros is then decoded, and the result of the initial address calculator 5 is stored in bank A of the second data buffer 14. In decoding run_before, run_before is stored in bank A of the second data buffer. The bank control signal is then set to "1".

In the processing of the second block, LEVEL is written to bank B of the first data buffer 4b when decoding the LEVEL, and result of the initial address calculator 5 and run_before is written to bank B of the second data buffer 14 when decoding the total_zeros and run_before. In the processing of the second block, the reading process of bank A of the second data buffer 14 is performed. The writing to bank A of the information register 7b is performed based on the read information.

In the processing of the third block, LEVEL is written to bank C of the first data buffer 4b when decoding the LEVEL, and result of the initial address calculator 5 and run_before is written to bank C of the second data buffer 14 when decoding the total_zeros and run_before. In the processing of the third block, the reading process of bank B of the second data buffer 14 is performed, and the writing to bank B of the information register 7b is performed based on the read information. Furthermore, the value of bank A of the first data buffer 4b is read based on the information of bank A of the information register 7b. The bank control signal is created separately for the first data buffer 4b, the second data buffer 14, and the information register 7b.

In the reading process, the first data buffer 4b reads the data of a bank greater by "1" than the value indicated by the bank control signal. That is, the first data buffer 4b reads bank C if the bank control signal indicates "1", reads bank A if the bank control signal indicates "2", and reads bank B if the bank control signal indicates "0". The second data buffer 14 and the information register 7b read the data of a bank smaller by "1" than the value indicated by the bank control signal. That is, the second data buffer 14 and the information register 7b read bank A if the bank control signal indicates "1", read bank B if the bank control signal indicates "2", and read bank C if the bank control signal indicates "0".

[Clock Control]

Since only two banks, write bank and read bank, are used, the bank control signal may be used as a clock control signal to stop the clock of the unused bank. This has the following advantages.

Since the data buffer 4b and the information register 7b have a bank configuration, the variable length decoding of the next block can be performed without waiting for the reading of the data buffer 4b thereby speeding up the process.

Furthermore, since the second data buffer 14 is arranged, the second data buffer 14 is configured to simultaneously write all the decoded run_before when the decoding of run_before is performed at high speed, so that the variable length decoding of the next block can be performed without waiting for the writing to the information register 7b to terminate. Further speed up of the process is thereby achieved. Moreover, the power consumption is suppressed and power reduction is achieved since the clock of the unused bank can be stopped using the bank control signal.

Third Embodiment

Figure 14:
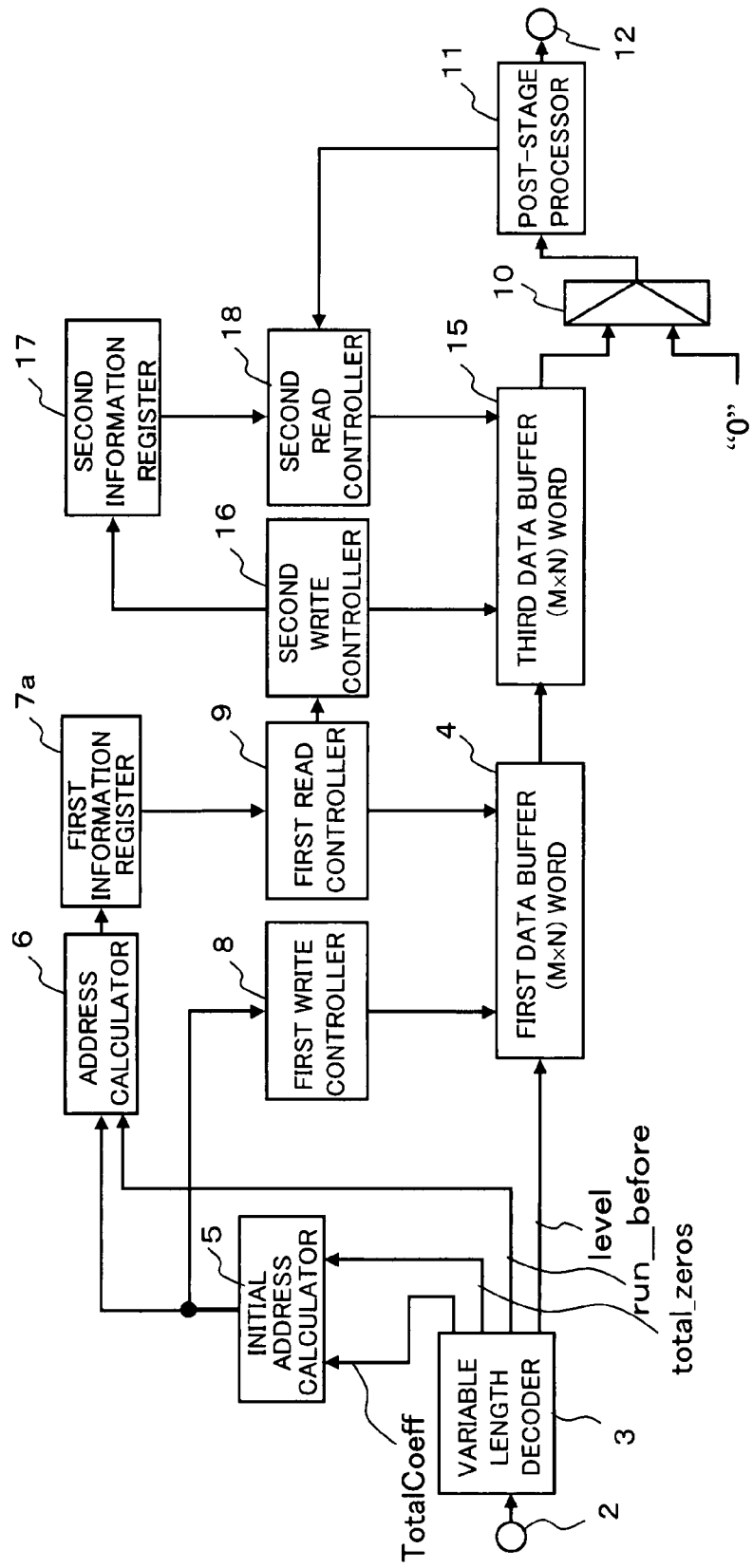
FIG. 14 is a block diagram showing a configuration of the variable length decoding device according to a third embodiment of the present invention.

The variable length decoding device according to the embodiment of the present invention will now be described with reference to the drawings. FIG. 14 shows a schematic configuration of the variable length decoding device according to the third embodiment of the present invention. For the sake of convenience of the explanation, the same reference characters are denoted for the same configurations as in the first embodiment, and the description thereof will be partially omitted.

The variable length decoding device further includes a third data buffer 15, a second write controller 16, a second information register 17, and a second read controller 18 with respect to the variable length decoding device of the first embodiment.

Figure 15:
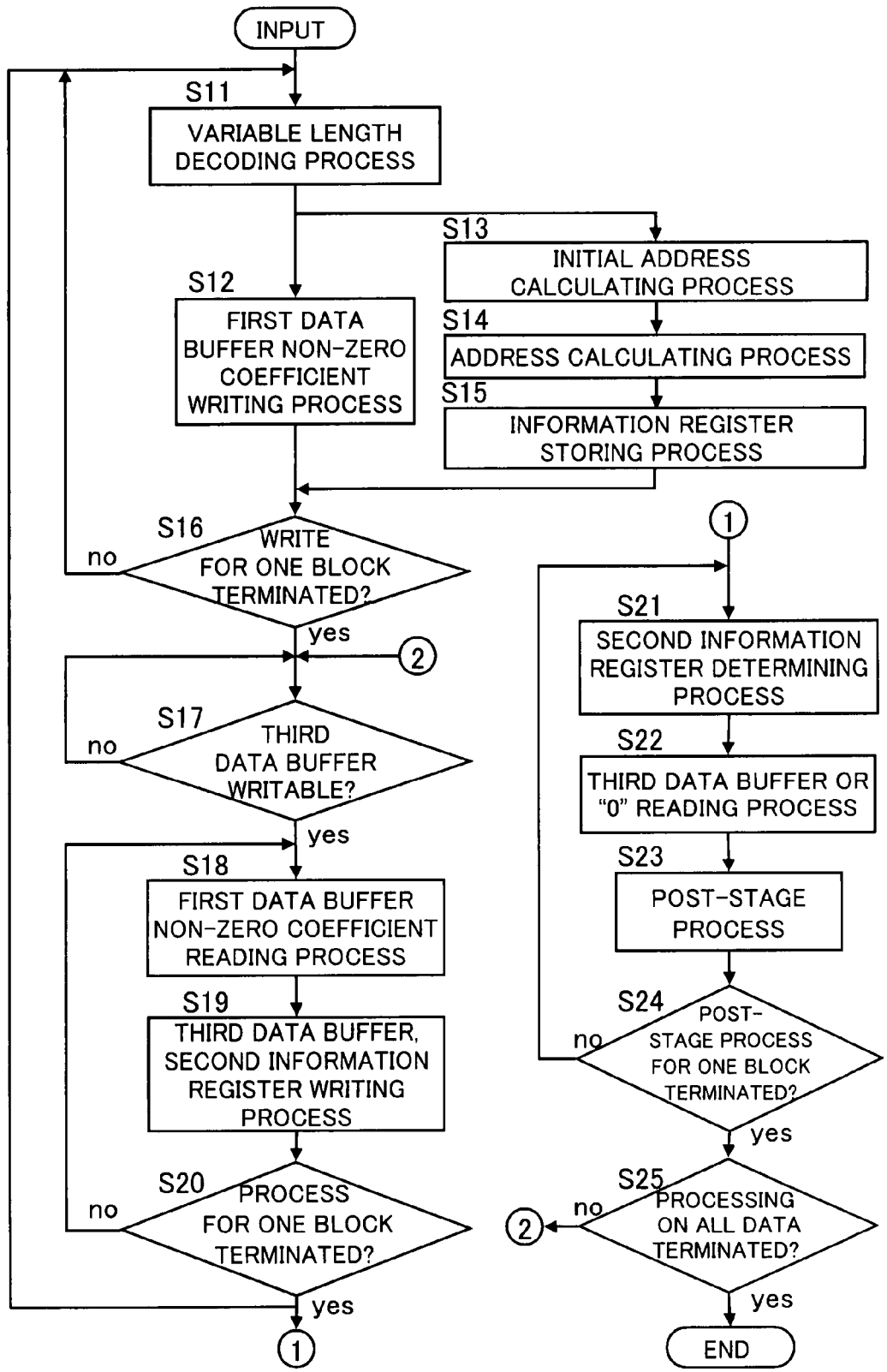
FIG. 15 is a flowchart showing the operation of the variable length decoding device according to the third embodiment of the present invention.

The operation of the variable length decoding device of the third embodiment will now be described with reference to the drawings. FIG. 15 is a flowchart of the process in the variable length decoding device of the third embodiment of the present invention. The flow of the process will be described below according to FIG. 15.

TotalCoeff, LEVEL, total_zeros, and run_before equivalent to one block are decoded by the variable length decoder 3 (step S11), and after run_before is written to the first information register 7a (steps S12 to S16), the first read controller 9 determines the recorded content of the first information register 7a (step S17). The address equivalent to the bit determined to have "1" stored in the first information register 7a is output to the first data buffer 4, and the LEVEL stored at the address is read (step S18). The second write controller 16 writes the data stored in the first data buffer 4 to the third data buffer 15 in conjunction with the first read controller 9, and writes the value of the first information register 7a to the second information register 17 (step S19).

After the writing to the third data buffer 15 and the second information register 17 for one block is terminated (Yes in step S20), the second read controller 18 determines the recorded content of the second information register 17 (step S21). The address equivalent to the bit determined to have "1" stored in the second information register 17 is output to the third data buffer 15, and the LEVEL stored at the address is read (step S22).

The next process is performed in the selector 10 at the same time when the second read controller 18 determines the second information register 17. That is, if the bit of the second information register 17 is "0", "0" is output to the post-stage processor 11 via the selector 10. If the bit is "1", the output data LEVEL of the third data buffer 15 is output to the post-stage processor 11 via the selector 10 (step S23). Simultaneously, the variable length decoder 3 starts decoding the next block (step S21), where TotalCoeff, LEVEL, total_zeros and run_before equivalent to one block are decoded (step S22), and if the process of the post-stage processor 11 is terminated (Yes in step S24), the above operation is repeated (step S25), and if not terminated (No in step S24), the process returns to step S1 and waits until the data for the next block is transferred.

[Bank Configuration of the Third Data Buffer]

Figure 16:
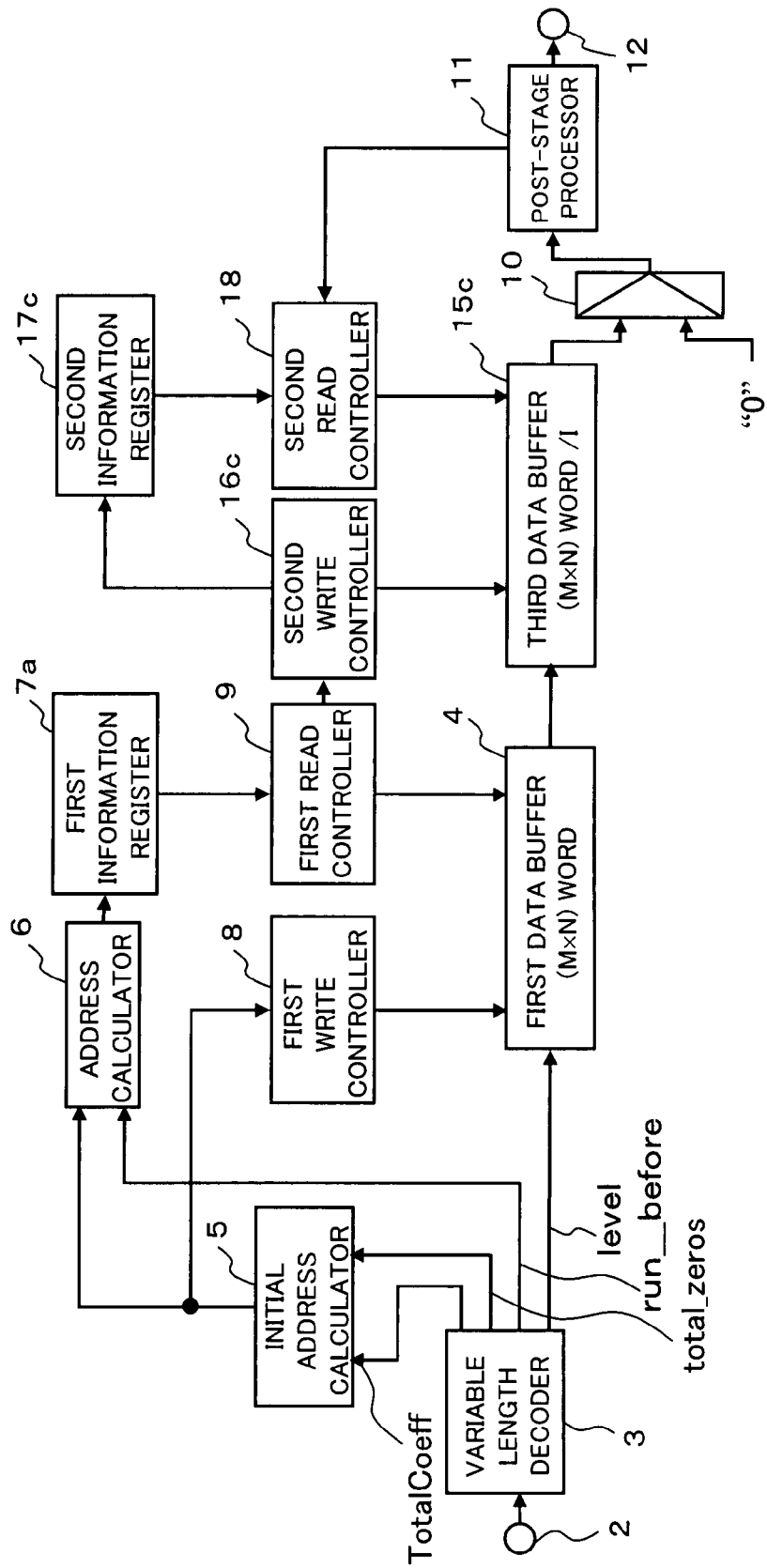
FIG. 16 is a block diagram showing a configuration of the variable length decoding device according to the third embodiment of the present invention (I divided third data buffer)

In the present embodiment, the configuration may be such that while the third data buffer 15c has an I bank configuration (I is a natural number greater than or equal to two), writing to the second information register 17c and the third data buffer 15c is performed after converting the writing order in the second write controller 16c, as shown in FIG. 16.

FIG. 17 shows the conversion of the writing order. FIG. 17(a) shows the storing position of the first information register 7a. FIG. 17(b) shows the reading order (zigzag scanning order) of the first information register 7a. FIG. 17(c) shows values stored in the first data buffer 4. FIG. 17(d) shows a bank configuration example of the third data buffer 15c. In this example, four banks A, B, C, and D are lined in the horizontal direction, and addresses 1, 2, 3, and 4 are set in the vertical direction.

FIG. 17(e) is the first data writing procedure on the third data buffer 15c. As apparent from FIGS. 17(a) and 17(b), data "+23" is written to address 1 of bank A since data exists at address 1. FIG. 17(f) is the writing of the second data, where "−4", or the data of address 2, is written to address 1 of bank B. FIG. 17(g) is the writing of the third data, where "+11", or the data of address 3, is written to address 2 of bank A. FIG. 17(h) is the writing of the fourth data, where "+8", or the data of address 5, is written to address 2 of bank B. FIG. 17(i) is the writing of the fifth data, where "−3", or the data of address 7, is written to address 1 of bank D. FIG. 17(j) is the writing of the sixth data, where "+1", or the data of address 10, is written to address 4 of bank A. FIG. 17(k) is the writing of the seventh data, where, "−1" or the data of address 12, is written to address 3 of bank C.

FIG. 18 shows the address conversion table from the first information register 7a to the second information register 17c performed through the third data buffer 15c. The storing position is also converted for the second information register 17c according to the conversion table.

Through the conversion to such array, requests made by the post-stage processor 11 to read the data not in the zigzag scanning order but in the transverse order can be responded, and a plurality of data can be read simultaneously.

Figure 19:
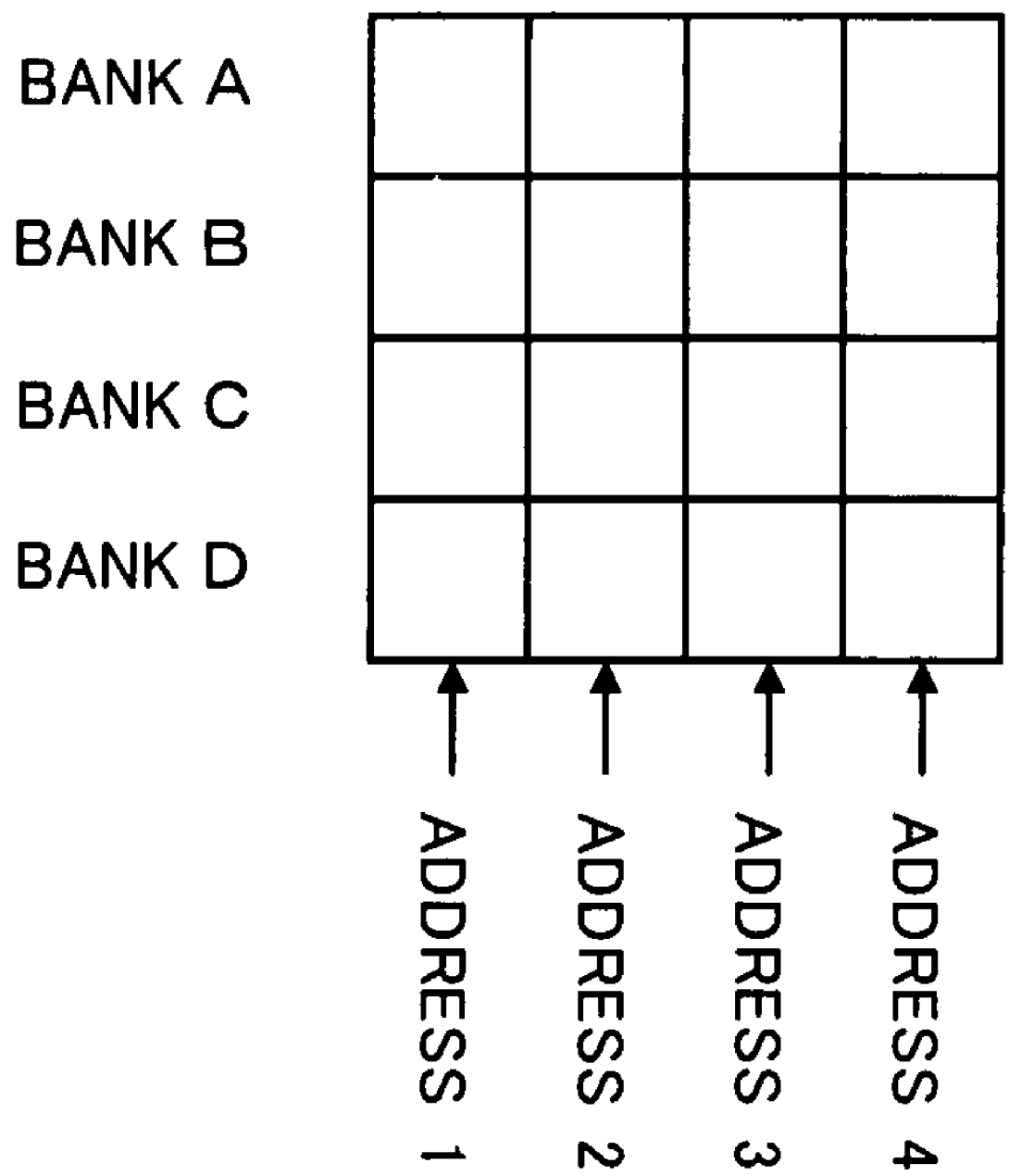
FIG. 19 shows another configuration of the third data buffer according to the third embodiment.

As shown in FIG. 19, four banks A, B, C, and D are lined in the vertical direction, and addresses 1, 2, 3, and 4 are set in the horizontal direction, so that a plurality of data can be read simultaneously in the vertical order.

The present embodiment configured as above has the following advantages. That is, the data of the first data buffer 4 can be output without waiting for the process of the post-stage processor 11. Furthermore, it is made possible that only the LEVEL is transferred between the data buffers, and in consequence, the next variable length decoding can be performed, which further speeds up the decoding process.

Moreover, the third data buffer 15c has a bank configuration, and the address is converted when writing data to the third data buffer 15c and the second information register 17, so that the data reading order on the post-stage processing can be diversified and a plurality of data can be read simultaneously, whereby a decoding device in which the reading speed of the post-stage processing is high speed is realized.

In the present embodiment, the third data buffer 15c has a bank configuration, but the third data buffer 15c may be configured by a buffer capable of bit enable control. The buffer division is thus not necessary, and thus the control signal is saved, and a configuration of a smaller circuit size is realized.

Fourth Embodiment

Figure 20:
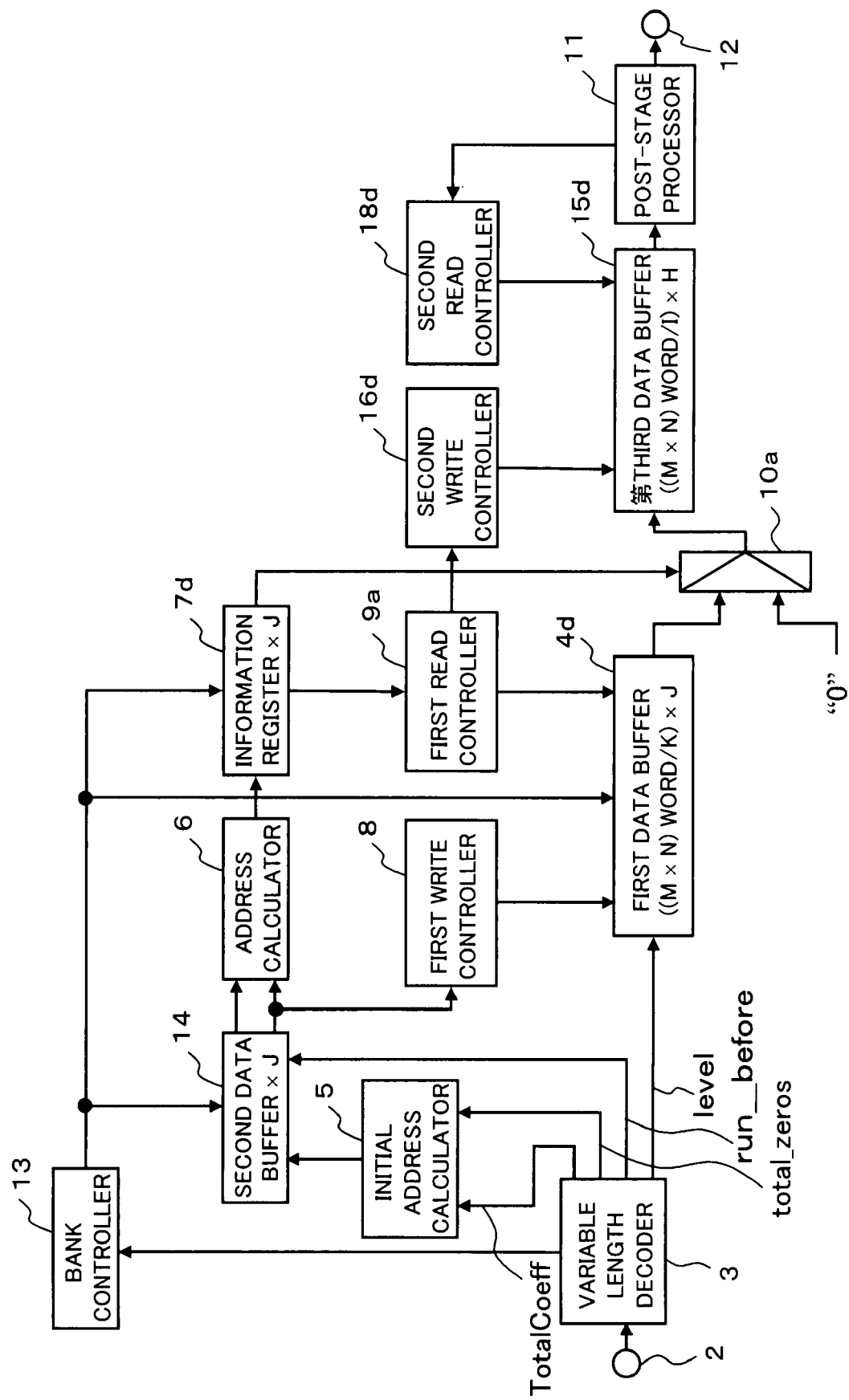
FIG. 20 is a block diagram showing a configuration of the variable length decoding device according to a fourth embodiment of the present invention.

The variable length decoding device according to the fourth embodiment of the present invention will now be described with reference to the drawings. FIG. 20 shows a schematic configuration of the variable length decoding device according to the fourth embodiment of the present invention, which will be described below. For the sake of convenience of the explanation, the same reference characters are denoted for the same configurations as in the first embodiment, second embodiment, or third embodiment and the description thereof will be partially omitted.

The variable length decoding device of the present embodiment includes the first data buffer 4d having a J bank configuration while being divided into K banks with respect to the configuration of the variable length decoding device of the second embodiment. Moreover, the third data buffer 15d, the second write controller 16d, and the second read controller 18d are further added.

Figure 21:
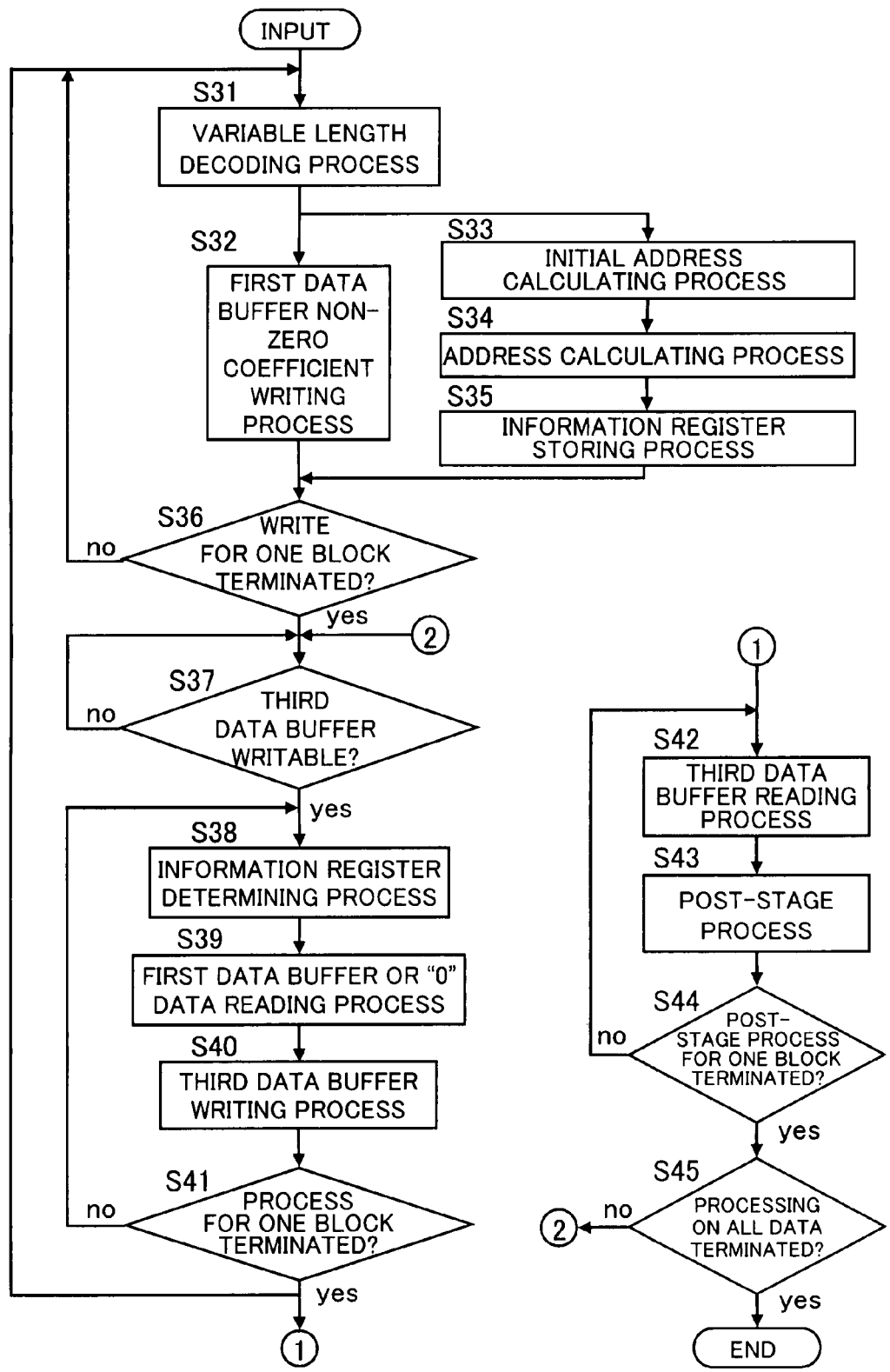
FIG. 21 is a flowchart showing the operation of the variable length decoding device according to the fourth embodiment of the present invention.

The operation of the variable length decoding device of the fourth embodiment configured as above will now be described with reference to the drawings. FIG. 21 is a flowchart of the process in the variable length decoding device of the fourth embodiment of the present invention. The flow of the process will be described below according to FIG. 21.

TotalCoeff, LEVEL, total_zeros, and run_before equivalent to one block are decoded by the variable length decoder 3 (step S31), and run_before is written to the information register 7a (steps S32 to S36). The first read controller 9a determines the stored content on the information register 7d (steps S37 to S38), and the address equivalent to the bit having "1" stored in the information register 7d is output to the first data buffer 4d and the LEVEL stored at the address is read from the first data buffer 4d (step S39).

At the same time when the first read controller 9a determines the stored content of the information register 7d, the selector 10a outputs "0" if the bit of the information register 7d is "0" and outputs the output data LEVEL of the first data buffer 4d if the bit of the information register 7d is "1" to the third data buffer 15d, respectively. (step S39).

The second write controller 16d writes the data from the selector 10d to the third data buffer 15d in conjunction with the first read controller 9a (step S40). After the writing to the third data buffer 15d for one block is terminated (Yes in step S41), the second read controller 18d reads the data from the third data buffer 15d (step S42), and outputs the data to the post-stage processor 11 (step S43). Simultaneously, the variable length decoder 3 starts decoding the next block (step S44).

Moreover, after TotalCoeff, LEVEL, total_zeros, and run_before equivalent to one block are decoded in the variable length decoder 3 (step S31), and the process by the post-stage processor 11 is terminated (Yes in step S44), the above operations are repeated (step S45), and if not terminated, waits for the next data to be transferred.

FIG. 22 shows a bank configuration example of the third data buffer 15d, and FIG. 23 shows a conversion table of converting the address of the first information register 7d to that of the third data buffer 15d and the second information register 17. When K=4, the first read controller 9d reads the four data simultaneously from the first data buffer 4d and the first information register 7d, and causes each of the read values to be replaced with "0" in the selector 10a based on the value of the information register 7d. The four data can be simultaneously written to the third data buffer 15d with the bank configuration shown in the present example. The third data buffer 15d has a configuration of holding H banks of buffers divided into I banks, but H merely needs to be the same as or larger than J.

Figure 24:
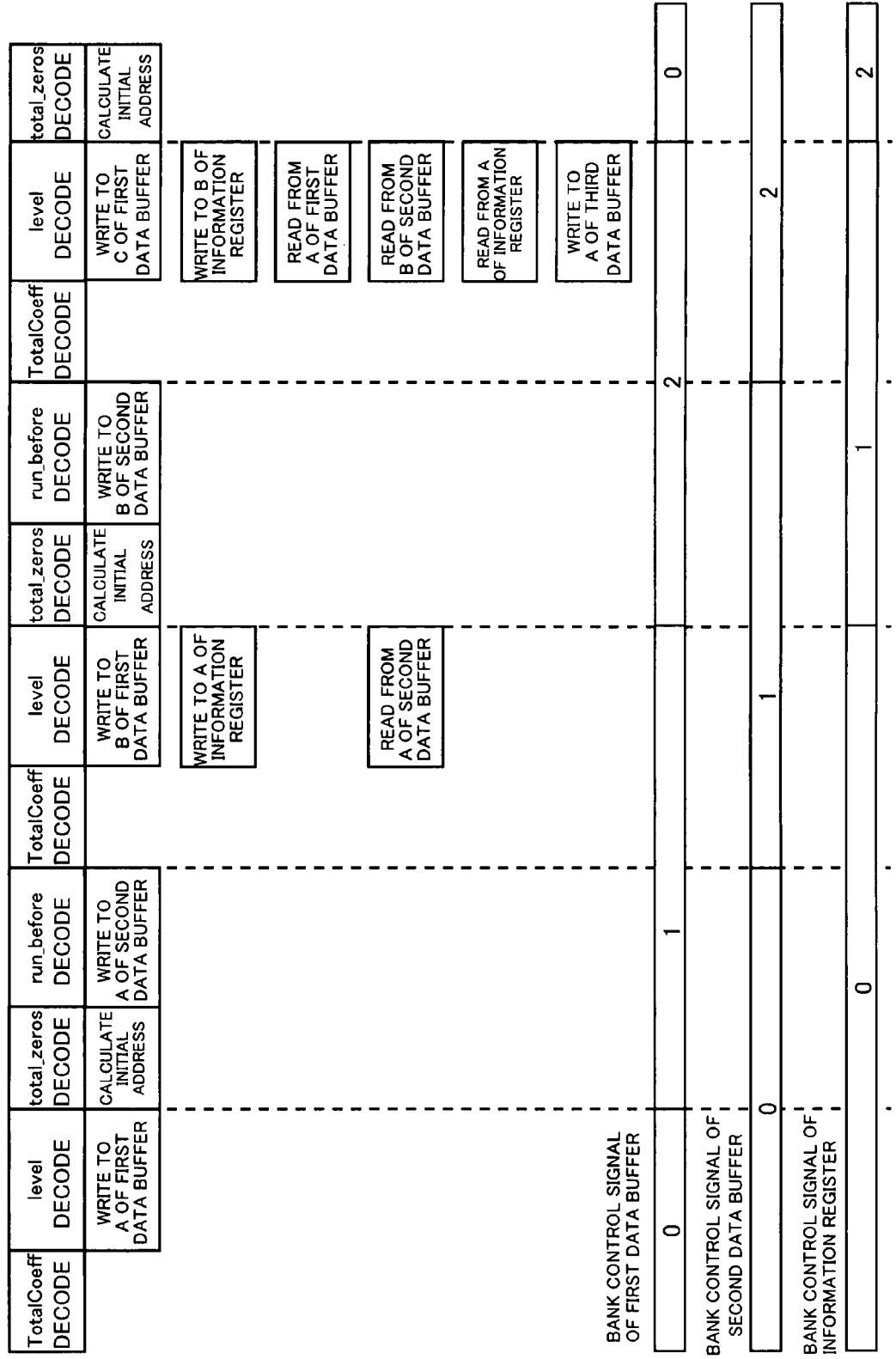
FIG. 24 is a process flowchart in the fourth embodiment of the present invention.

FIG. 24 shows the data flow of the fourth embodiment. The data flow of FIG. 24 differs from the data flow of FIG. 12 only in that writing to the third data buffer is performed. The present embodiment having the above configuration has the following advantages.

The data of the first data buffer 4d is output without waiting for the process of the post-stage processor 11, and in consequence, the next variable length decoding can be performed, thereby speeding up the decoding process.

A plurality of data can be read from the first data buffer 4d and a plurality of data can be written simultaneously to the third data buffer 15d, whereby high speed reading is achieved even when all coefficient data are read from the first data buffer 4d, and a decoding circuit can be configured without the second information register.

Therefore, a decoding process device enabling speedup with a small circuit size can be built.

Fifth Embodiment

Figure 25:
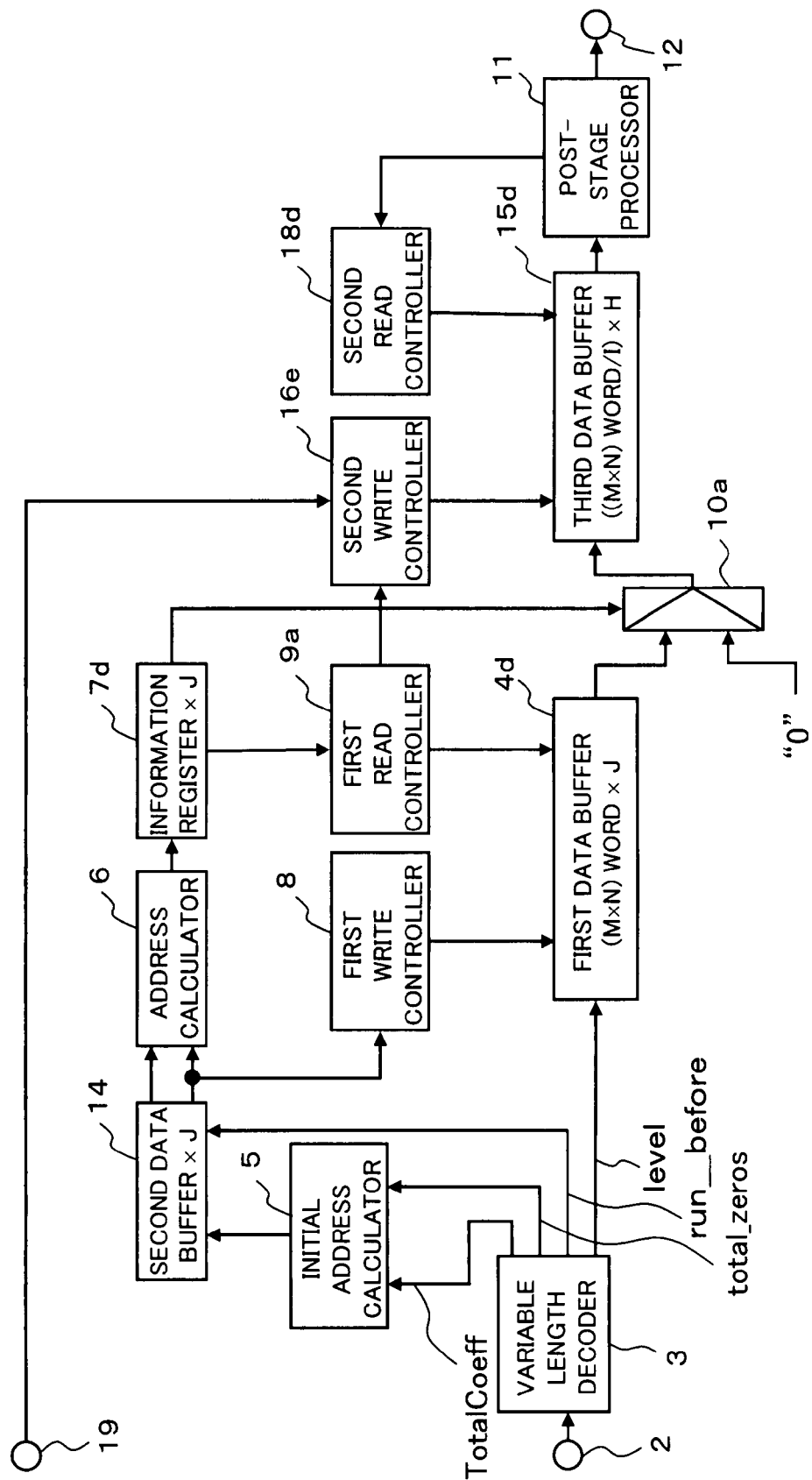
FIG. 25 is a block diagram showing a configuration of a variable length decoding device according to a fifth embodiment of the present invention.

A variable length decoding device according to a fifth embodiment of the present invention will now be described with reference to the figures. FIG. 25 shows a schematic configuration of the variable length decoding device according to the fifth embodiment of the present invention, which will be described below. For the sake of convenience of the explanation, the same reference characters are denoted for the same configurations as in the first embodiment to the fourth embodiment, and the description thereof will be partially omitted.

The variable length decoding device has the same configuration as the variable length decoding device of the fourth embodiment, but differs from that of the fourth embodiment in that a scan selection signal 19 is input to a second write controller 16e.

The address conversion from the first data buffer 4d read in the zigzag scanning order has been described in the fourth embodiment, but different scanning can be responded by changing the address to be converted according to the scan selection signal 19. As a result, the third data buffer 15d is commonly shared with MPEG 4 etc. having different scanning modes, and a decoding device suited to a plurality coding modes is realized with a small circuit size.

Sixth Embodiment

Figure 26:
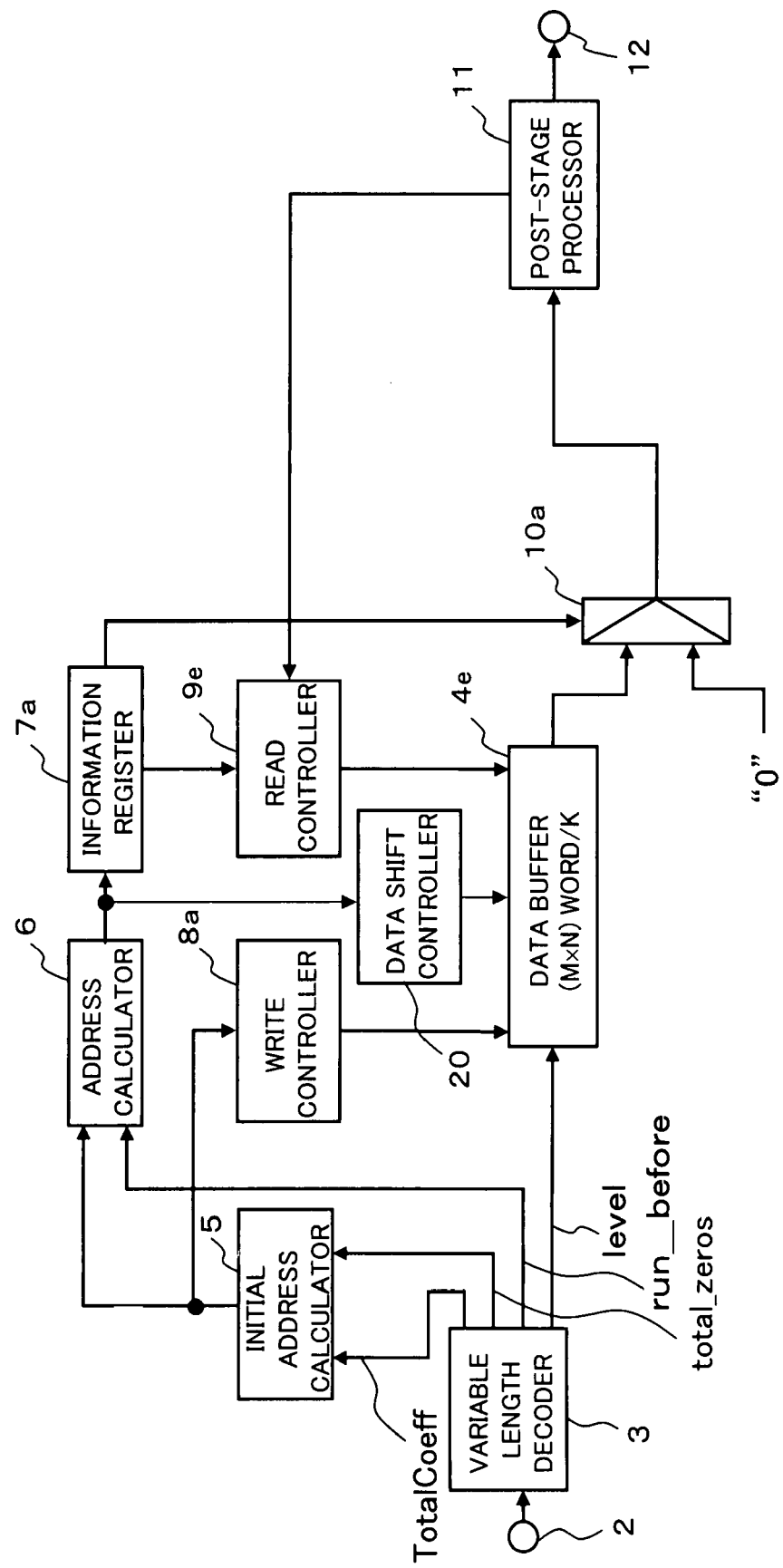
FIG. 26 is a block diagram showing a configuration of a variable length decoding device according to a sixth embodiment of the present invention.

A variable length decoding device according to a sixth embodiment will now be described with reference to the drawings. FIG. 26 shows a schematic configuration of the variable length decoding device according to the sixth embodiment, which will be described below. For the sake of convenience of the explanation, the same reference characters are denoted for the same configurations as in the first embodiment to the sixth embodiment, and thus the explanation thereof will be partially omitted. A case when the data of one block is divided into four by four will be described in the present embodiment.

Figure 27:
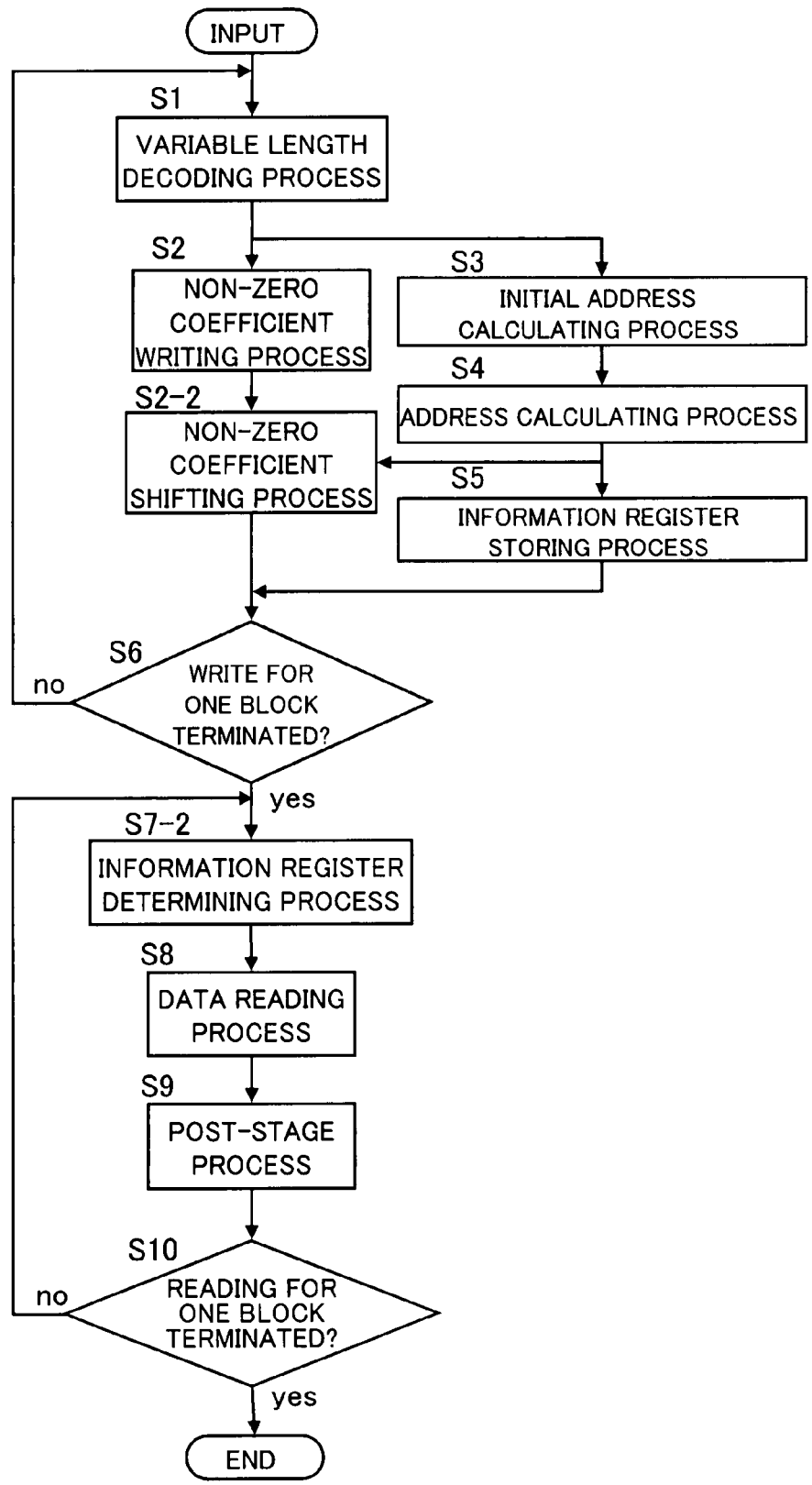
FIG. 27 is a flowchart showing the operation of the variable length decoding device in the sixth embodiment.

The variable length decoding device of the present embodiment has the same configuration as the variable length decoding device of the second embodiment, but allows the data buffer 4e to simultaneously shift M×N data by adding a data shift controller 20, and furthermore, has a different controlling method for the read controller 9e. The operation of the variable length decoding device of the seventh embodiment configured as above will now be described with reference to the drawings. FIG. 27 is a flowchart of the process in the variable length decoding device of the present embodiment. The operation of the variable length decoding device of the present embodiment is similar to the operation of the first embodiment, but differs from that of the first embodiment in that the LEVEL representing the size of decoded non-zero coefficient value (step S2) is data shifted (step S2-2) according to the result of (step S4). In the operation example of the first embodiment shown in FIG. 5, the address of 12→10→7→5→3→2→1 is calculated in (step S4). This corresponds to −1→+1→−3→+8→+11→−4→+23 of the LEVEL.

FIG. 28A to FIG. 28H show an example in which the LEVEL −1→+1→−3→+8→+11→−4→+23 is moved to the address position of 12→10→7→5→3→2→1 every time the run_before is calculated in (step S2-2).

Figure 8:
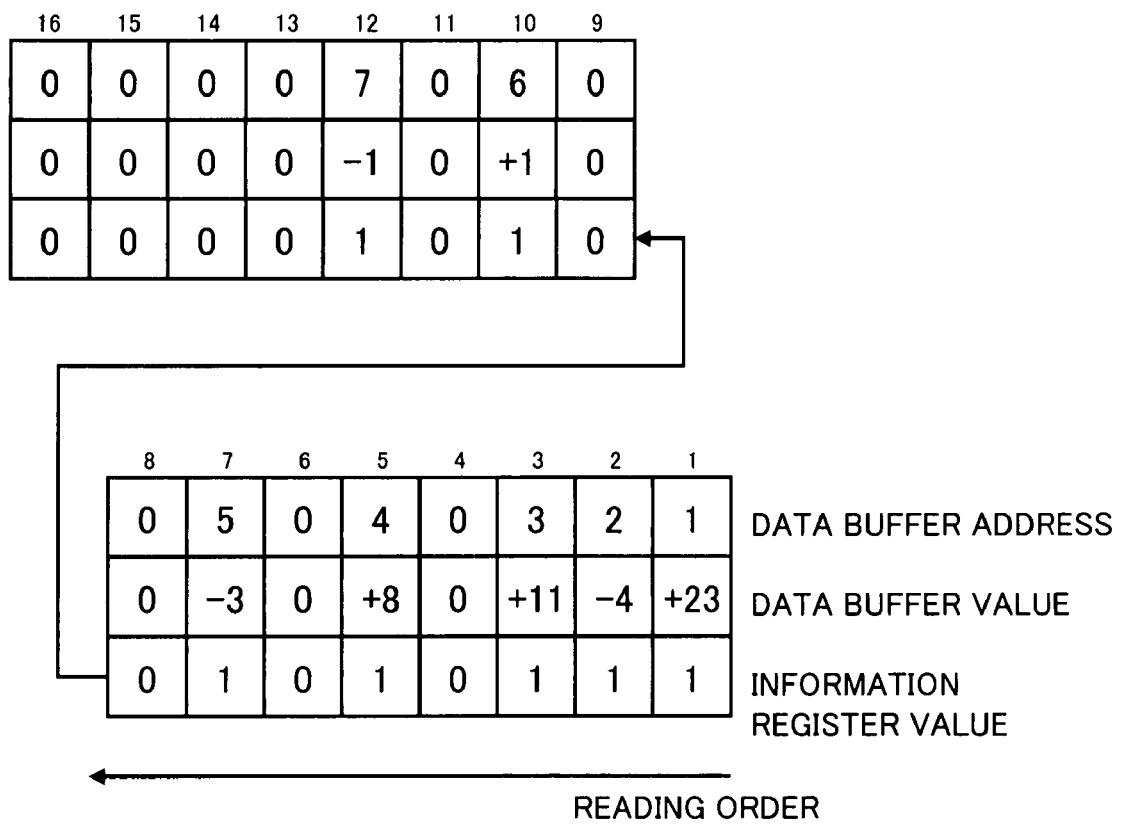
FIG. 8 is an explanatory view of address transition in the device of FIG. 7 using the actual example of FIG. 3.
Figure 28A:
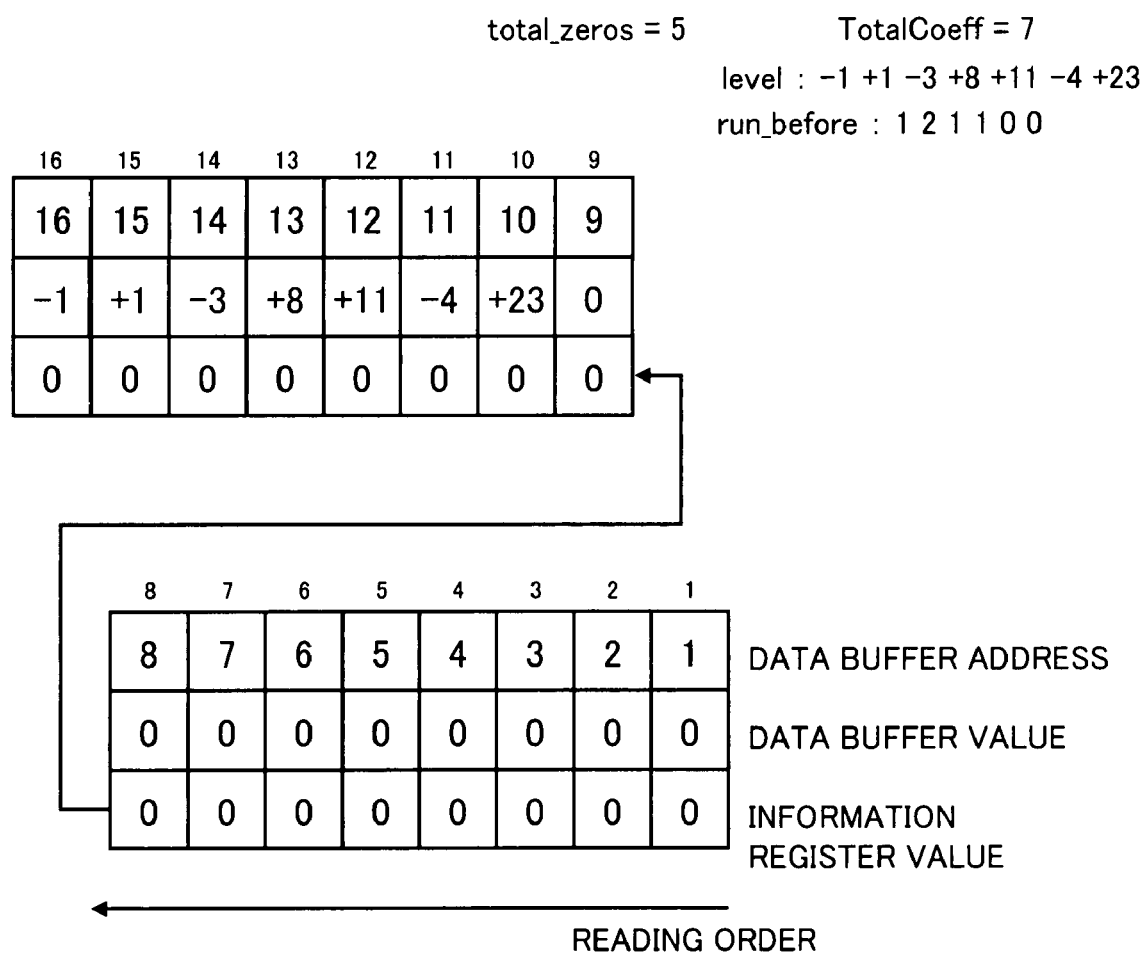

The explanation of FIG. 28A to FIG. 28H is based on the reading order similar to the reading order shown in FIG. 8. FIG. 28A shows the state in which the decoded non-zero coefficient value is in the data buffer 4e (step S2). FIG. 28B shows the state in which the data is shifted to the position of address "12" based on the initial address="12" calculated by (step S4). FIG. 28C shows the state in which the data excluding the data of address "16" to address "13" is shifted to the position of address "10" based on the address="10" calculated by (step S4). FIG. 28D shows the state in which the data excluding the data of address "16" to address "10" is shifted to the position of address "7" based on the address="7" calculated by (step S4). FIG. 28E shows the state in which the data excluding the data of address "16" to address "7" is shifted to the position of address "5" based on the address="5" calculated by (step S4). FIG. 28F shows the state in which the data excluding the data of address "16" to address "5" is shifted to the position of address "3" based on the address="3" calculated by (step S4). FIG. 28G shows the state in which the data excluding the data of address "16" to address "3" is shifted to the position of address "2" based on the address="2" calculated by (step S4). FIG. 28H shows the state in which the data excluding the data of address "16" to address "1" is shifted to the position of address "1" based on the address="1" calculated by (step S4).

Figure 29:
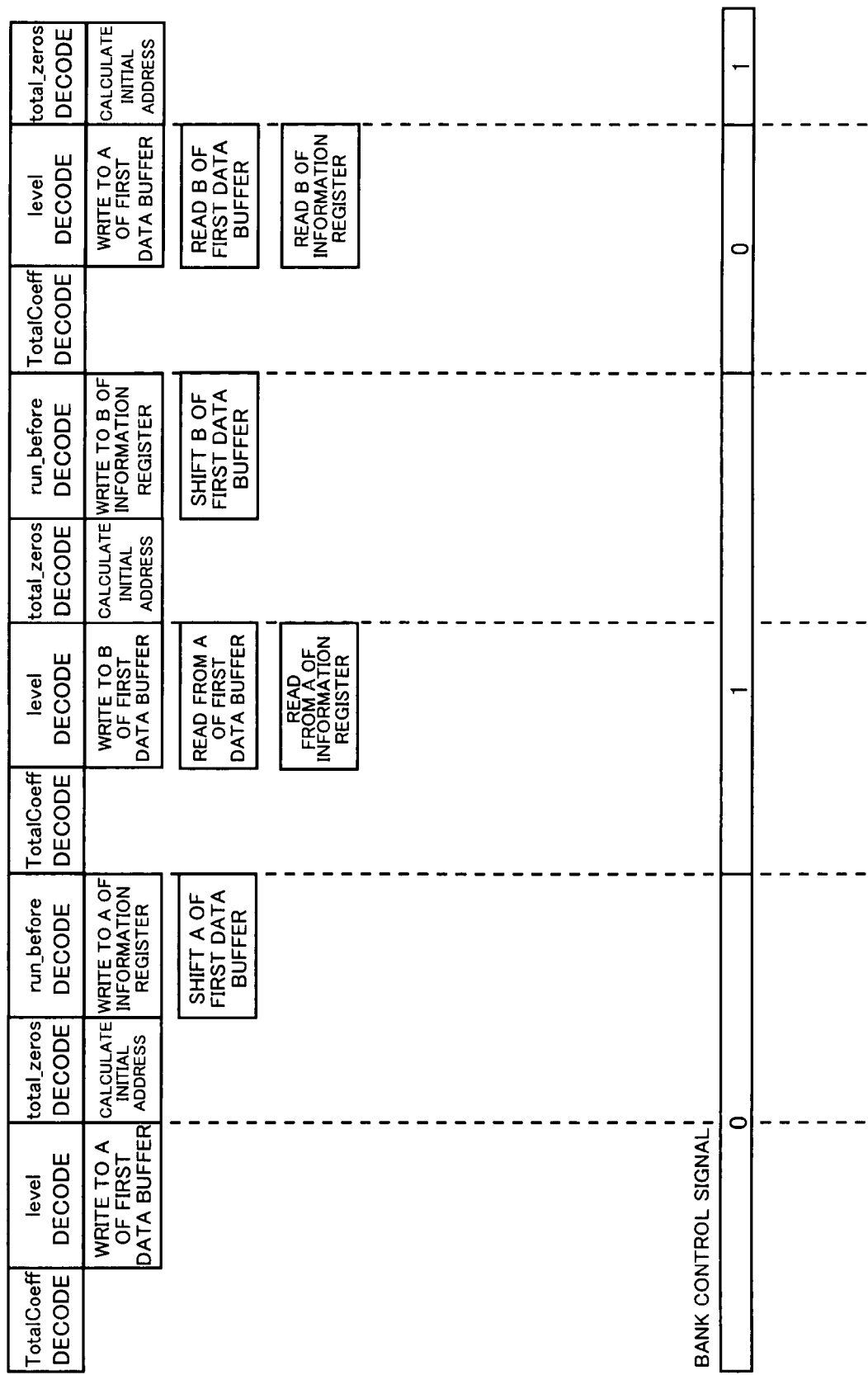
FIG. 29 is a process flowchart in the sixth embodiment.

In the information register 7, "1", for instance, is stored for the calculated address as the address of LEVEL, and "0" is stored for the remaining of the block (step S5). Determination is made on whether the calculation of address for one block is terminated, and if not terminated, the process returns to step S1, and if terminated, the process proceeds to the reading process (step S6). FIG. 29 is an example of the data flow in the variable length decoding device of FIG. 26. The two bank configuration of J=2 will be described by way of example.

The data flow of the present embodiment is similar to the second embodiment, but differs in that a shift operation of bank A of the data buffer 4b is performed in writing data to bank A of the information register 7b when decoding run_before, and differs in that the address is incremented by one from the initial value 1 to read bank A of the data buffer 4b instead of performing the read address calculation based on the value of bank A of the information register 7b when reading. The present embodiment configured in this manner has the following advantages.

The information register 7 can be utilized in the variable length coded data of H.264 since the data shift controller 20 is arranged, and the read control circuit is readily formed since the data buffer address does not need to be calculated using the value of the information register.

Seventh Embodiment

Figure 30:
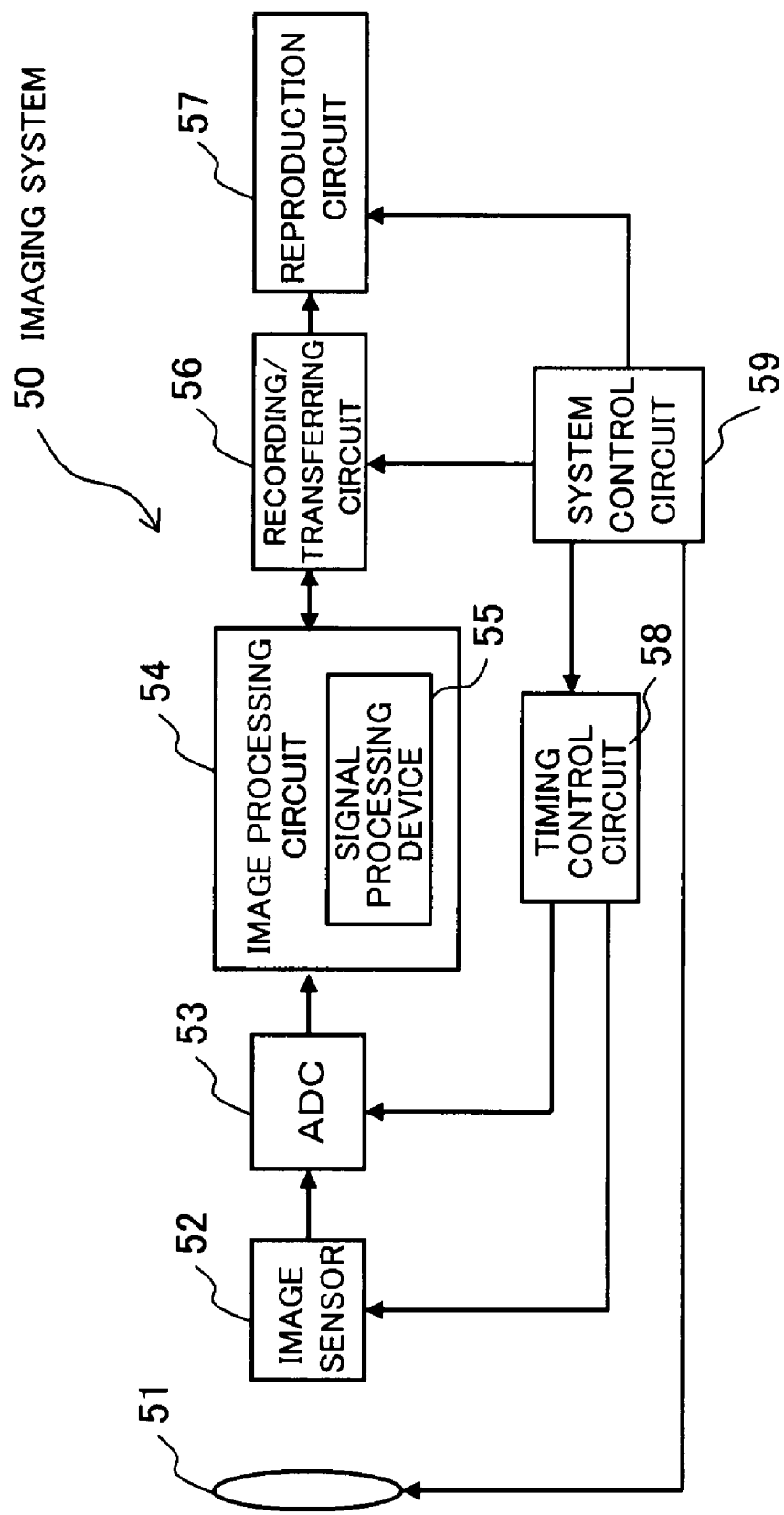
FIG. 30 is a block diagram showing a configuration of an image capturing system according to a seventh embodiment of the present invention.
Figure 31:
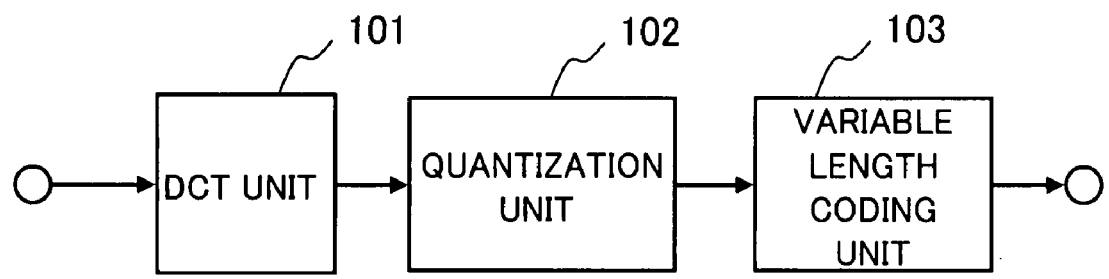
FIG. 31 is a block diagram showing a configuration of a typical image coding device.
Figure 32:
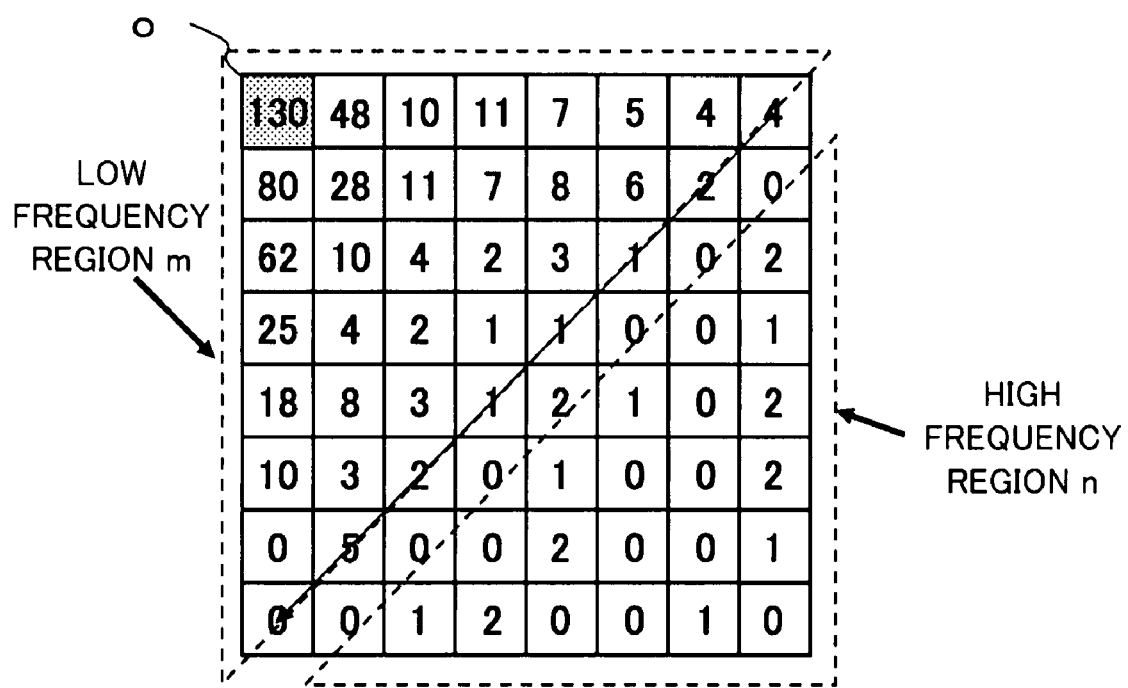
FIG. 32 is an explanatory view of one example of a DCT coefficient.

FIG. 30 is a view showing a configuration of an image capturing system 50 such as a digital still camera (DSC) according to the sixth embodiment of the present invention. The signal processing device 55 in FIG. 30 is one of the variable length decoding devices of the first to the fifth embodiments of the present invention.

According to FIG. 30, the image light having entered through the optical system 51 is imaged on the image sensor 52. The image sensor 52 is driven by a timing control circuit 58, so that the imaged image light is accumulated and photo-electric transferred to an electric signal. The electric signal read from the image sensor 52 is converted to a digital signal by an analog/digital converter (ADC) 53, and then input to an image processing circuit 54 including the signal processing device 55. In the image processing circuit 54, image processing such as Y/C process, edge process, enlargement/reduction of image, image compression/decompression process using the present invention etc. is performed. The image processed signal is recorded on or transferred to the media in the recording/transferring circuit 56. The recorded or transferred signal is reproduced by a reproduction circuit 57. The entire image capturing system 50 is controlled by a system control circuit 59.

The image processing in the signal processing device 55 of the present embodiment of the present invention is not necessarily applied only to signals based on the image light imaged on the image sensor 52 through the optical system 51, and may obviously be applied in processing image signals input as electric signals from an external device.

Although the invention has been described in details in its preferred form with a certain degree of particularity, it is understood that the combination and arrangement of parts in the preferred form may be changed in various ways without departing from the spirit and the scope of the invention as hereinafter claimed.

What is claimed is:

1. A variable length decoding device for decoding variable length coded/run length coded data; the variable length decoding device comprising:
   a variable length decoder for sequentially decoding the externally input variable length coded/run length coded data to TotalCoeff representing the number of non-zero coefficients, LEVEL representing the size of a non-zero coefficient value, total_zeros representing the number of zero coefficients before the last LEVEL in the data scanning direction, run_before representing the number of successive zero coefficients before the LEVEL in the data scanning direction;
   a first data buffer for storing the LEVEL;
   a write controller for writing the LEVEL to the first data buffer in the decoded order;
   an initial address calculator for calculating the initial address of the LEVEL from the TotalCoeff and the number of zero coefficients of the total_zeros;

an address holder for determining and holding the address of the LEVEL corresponding to data based on the initial address and the number of zero coefficients by the run_before;

a read controller for reading the LEVEL from the first data buffer based on the address information held by the address holder;

a selector for selecting either the LEVEL stored in the first data buffer or the zero coefficients based on the address information held by the address holder; and a post-stage processor for post-stage processing the data selected by the selector, wherein the address holder includes, an address calculator for calculating the address of the LEVEL corresponding to data based on the initial address and the number of the run_before; and an information register for controlling the selector and the read controller based on the address of the LEVEL calculated by the address calculator and the TotalCoeff.

2. The variable length decoding device according to claim 1, wherein the write controller calculates an effective address by sequentially subtracting the value of the total_zeros from the address of the TotalCoeff, and writing the effective address to the data buffer.

3. The variable length decoding device according to claim 1, wherein the first data buffer alternately stores the LEVEL with K (K is a natural number greater than or equal to two) banks and simultaneously reads K data based on the value of the information register.

4. The variable length decoding device according to claim 1, further comprising a second data buffer for storing the initial address and the run_before.

5. The variable length decoding device according to claim 1, further comprising:

a bank controller; wherein the first data buffer and the information register have a plurality of sets of bank configuration; and the bank controller switches among the plurality of banks in each of the information register and the first data buffer.

6. The variable length decoding device according to claim 5, wherein the bank controller provides a clock only to the bank selected in the information register and the plurality of data buffers.

7. The variable length decoding device according to claim 1, further comprising:

a third data buffer for storing the stored data of the first data buffer;

a second write controller for controlling the write to the third data buffer in conjunction with the operation of the read controller;

a second information register for receiving and storing the same register value as that of the information register through the second write controller; and a second read controller for controlling the reading of the third data buffer based on the register value stored in the second information register; wherein the selector selects and outputs one of the LEVEL stored in the third data buffer or the zero coefficients based on the register value stored in the second information register; and the post-stage processor post-stage processes the data selected by the selector.

8. The variable length decoding device according to claim 1, further comprising:

a third buffer for storing the data selected by the selector;

a second write controller for controlling the writing to the third data buffer in conjunction with the operation of the read controller; and a second read controller for controlling the reading of the third data buffer; wherein the post-stage processor post-stage processes the output data of the third data buffer and outputs the data to the outside.

9. The variable length decoding device according to claim 7, wherein the third data buffer is configured by a plurality of data buffer rows or data buffer columns;

the second write controller writes the data read from the first data buffer to an address position of the third data buffer different from the address in the first data buffer and stores the data storing address in the third data buffer to the second information register; and the second read controller simultaneously reads the plurality of data from the third data buffer based on the stored information of the second information register.

10. The variable length decoding device according to claim 8, wherein the third data buffer is configured by a plurality of data buffer rows or data buffer columns;

the second write controller writes the data read from the first data buffer to an address position of the third, data buffer different from the address position in the first data buffer and stores the data storing address in the third data buffer to the second information register; and the second read controller simultaneously reads the plurality of data from the third data buffer based on the stored information of the second information register.

11. The variable length decoding device according to claim 9, wherein the third data buffer can change the array of the plurality of data buffer rows or data buffer columns; and the second write controller simultaneously writes the plurality of data read from the first data buffer to the third data buffer.

12. The variable length decoding device according to claim 10, wherein the third data buffer can change the array of the plurality of data buffer rows or data buffer columns; and the second write controller simultaneously writes the plurality of data read from the first data buffer to the third data buffer.

13. The variable length decoding device according to claim 7, wherein the third data buffer is configured by a bit enable controllable memory, the second write controller writes the data read from the first data buffer to an address position of the third data buffer different from the address position in the first data buffer, and stores the data storing address in the third data buffer to the information register; and the second read controller simultaneously reads the plurality of data from the third data buffer based on the information of the information register.

14. The variable length decoding device according to claim 8, wherein the third data buffer is configured by a bit enable controllable memory, the second write controller writes the data read from the first data buffer to an address position of the third data buffer different from the address position in the first data buffer, and stores the data storing address in the third data buffer to the information register; and the second read controller simultaneously reads the plurality of data from the third data buffer based on the information of the information register.

15. The variable length decoding device according to claim 7, wherein scan information is input to the second write controller, and writing address of the third data buffer is changed by the scan information.

16. The variable length decoding device according to claim 8, wherein scan information is input to the second write controller, and writing address of the third data buffer is changed by the scan information.

17. The variable length decoding device according to claim 1, wherein the post-processing processor is an inverse quantization processor.

18. A variable length decoding device for decoding variable length coded/run length coded data; the variable length decoding device comprising:
   a variable length decoder for sequentially decoding the externally input variable length coded/run length coded data to TotalCoeff representing the number of non-zero coefficients, LEVEL representing the size of a non-zero coefficient value, total_zeros representing the number of zero coefficients before the last LEVEL in the data scanning direction, run_before representing the number of successive zero coefficients before the LEVEL in the data scanning direction;
   a first data buffer for storing the LEVEL;
   a write controller for writing the LEVEL to the first data buffer in the decoded order;
   an initial address calculator for calculating the initial address of the LEVEL from the TotalCoeff and the number of zero coefficients of the total_zeros;
   an address holder for determining and holding the address of the LEVEL corresponding to data based on the initial address and the number of zero coefficients by the run_before;
   a data shift controller for shifting the LEVEL to the address position corresponding to data based on the initial address and the number of zero coefficients by the run_before;
   a read controller for reading the LEVEL from the first data buffer based on the address information held by the address holder;
   a selector for selecting either the LEVEL stored in the first data buffer or the zero coefficients based on the address information held by the address holder; and
   a post-stage processor for post-stage processing the data selected by the selector,
   wherein the address holder includes,
   an address calculator for calculating the address of the LEVEL corresponding to data based on the initial address and the number of the run_before; and
   an information register for controlling the selector and the read controller based on the address of the LEVEL calculated by the address calculator and the TotalCoeff.

19. The variable length decoding device according to claim 18, wherein the write controller calculates an effective address by sequentially subtracting the value of the total_zeros from the address of the TotalCoeff, and writes the effective address to the data buffer.

20. The variable length decoding device according to claim 18, wherein the first data buffer alternately stores the LEVEL with K (K is a natural number of greater than or equal to two) banks and simultaneously reads K data based on the value of the information register.

21. The variable length decoding device according to claim 18, further comprising a second data buffer for storing the initial address and the run_before.

22. The variable length decoding device according to claim 18, further comprising:
   a bank controller; wherein
   the first data buffer and the information register have a plurality of sets of bank configuration; and
   the bank controller switches among the plurality of banks in each of the information register and the first data buffer.

23. The variable length decoding device according to claim 22, wherein the bank controller provides a clock only to the bank selected in the information register and the plurality of data buffers.

24. The variable length decoding device according to claim 18, wherein the post-processing processor is an inverse quantization processor.

25. An image capturing system comprising:
   an image processing circuit, including the variable length decoding device according to claim 1, for performing image processing;
   a sensor for outputting an image signal to the image processing circuit; and
   an optical system for imaging light to the sensor.

26. The image capturing system according to claim 25, further comprising a converter for converting an image signal obtained from the sensor to a digital signal, and providing the digital signal to the image processing circuit.

27. An image capturing system comprising:
   an image processing circuit, including the variable length decoding device according to claim 20, for performing image processing;
   a sensor for outputting an image signal to the image processing circuit; and
   an optical system for imaging light to the sensor.

28. The image capturing system according to claim 27, further comprising a converter for converting an image signal obtained from the sensor to a digital signal and providing the digital signal to the image processing circuit.

29. A variable length decoding method for decoding variable length coded/run length coded data; the variable length decoding method comprising the steps of:
   an acquiring step for acquiring the variable length coded/run length coded data;
   a decoding step for sequentially decoding TotalCoeff representing the number of non-zero coefficients, LEVEL representing the size of a +non-zero coefficient value, total_zeros representing the number of zero coefficients before the last non-zero coefficients in the data scanning direction, run_before representing the number of successive zero coefficients before the non-zero coefficients in the data scanning direction from the a acquired variable length coded/run length coded data;
   a storing step for storing the LEVEL in a first data buffer;
   a calculation step for calculating the initial address of the LEVEL from the number of non-zero coefficients of the TotalCoeff and the number of zero coefficients of the total_zeros;
   a determining step for determining the address of the non-zero coefficients corresponding to data based on the initial address and the number of zero coefficients by the run_before;
   a reading step for reading the LEVEL from the data buffer based on the address of the non-zero coefficients;

a selecting step for selecting either the LEVEL stored in the first data buffer or the zero coefficients based on the address of the non-zero coefficients;

a post-stage processing step for post-stage processing the selected data, another storing step for storing the LEVEL read from the data buffer to another data buffer;

another providing step for providing an information register for controlling the selecting step and the reading step based on the address of the LEVEL and the TotalCoeff, and reading the LEVEL from said another data buffer based on a value of the information register; and another selecting step for selecting either the LEVEL stored in said another data buffer or the zero coefficient based on the value of the information register, wherein said another storing step executes the process if said another data buffer is writable.

30. The variable length decoding method according to claim 29, further comprising the steps of:

another storing step for storing the data selected from either the LEVEL stored in the data buffer or the non-zero coefficient to another data buffer;

another reading step for reading the data from said another data buffer; and another post-processing step for post-processing said another data read from the other data buffer; wherein said another storing step executes the process if said another data buffer is writable.

31. The variable length decoding method according to claim 29, further comprising the step of:

a converting step for converting the write address of the information register based on the externally input scan information; wherein said another storing step includes storing the LEVEL to said another data buffer after converting to a predetermined scanning order based on the scan information.

32. The variable length decoding method according to claim 29, wherein the post-stage processing step is an inverse quantization step.

33. A variable length decoding method for decoding variable length coded/run length coded data; the variable length decoding method comprising the steps of:

an acquiring step for acquiring the variable length coded/run length coded data;

a decoding step for sequentially decoding TotalCoeff representing the number of non-zero coefficients, LEVEL representing the size of the non-zero coefficient value, total_zeros representing the number of zero coefficients before the last non-zero coefficients in the data scanning direction, run_before representing the number of successive zero coefficients before the non-zero coefficients in the data scanning direction from the variable length coded/run length coded data;

a storing step for storing the LEVEL in a first data buffer;

a calculation step for calculating the initial address of the LEVEL from the number of non-zero coefficients of the TotalCoeff and the number of zero coefficients of the total_zeros;

a determining step for determining the address of the non-zero coefficients corresponding to t data based on he initial address and the number of zero coefficients by the run_before;

a shifting step for shifting the LEVEL to the address position of the LEVEL corresponding to data based on the initial address and the number of zero coefficients by the run_before;

a reading step for reading the LEVEL stored in the first data buffer based on the address information determined in the determining step;

a selecting step for selecting either the LEVEL stored in the first data buffer or the zero coefficients based on the address information determined in the determining step;

a post-processing step for post-stage processing the data selected by the selecting step, and another storing step for storing the LEVEL read from the data buffer to another data buffer;

another providing step for providing an information register for controlling the selecting step and the reading step based on the address of the LEVEL and the TotalCoeff, and reading the LEVEL from said another data buffer based on a value of the information register; and another selecting step for selecting either the LEVEL stored in said another data buffer or the zero coefficient based on the value of the information register;

wherein said another storing step executes the process if said another data buffer is writable.

34. The variable length decoding method according to claim 33, wherein the post-stage processing step is an inverse quantization step.

* * * * *